United States Patent
Hagihara

(10) Patent No.: US 8,917,337 B2
(45) Date of Patent: Dec. 23, 2014

(54) AD CONVERSION CIRCUIT AND IMAGING APPARATUS

(75) Inventor: Yoshio Hagihara, Tokyo (JP)

(73) Assignee: Olympus Corporation, Tokyo (JP)

( * ) Notice: Subject to any disclaimer, the term of this patent is extended or adjusted under 35 U.S.C. 154(b) by 321 days.

(21) Appl. No.: 13/523,137

(22) Filed: Jun. 14, 2012

(65) Prior Publication Data
US 2012/0320243 A1     Dec. 20, 2012

(30) Foreign Application Priority Data

Jun. 14, 2011   (JP) ................................ 2011-132196

(51) Int. Cl.
| | | |
|---|---|---|
| H04N 5/217 | (2011.01) | |
| H03M 1/48 | (2006.01) | |
| H04N 5/378 | (2011.01) | |
| H03M 1/12 | (2006.01) | |
| H03M 1/56 | (2006.01) | |

(52) U.S. Cl.
CPC ................ *H03M 1/48* (2013.01); *H04N 5/378* (2013.01); *H03M 1/123* (2013.01); *H03M 1/56* (2013.01)
USPC ........................................................ 348/241

(58) Field of Classification Search
CPC ..... H04N 5/361; H04N 5/3575; H04N 5/232; H04N 5/14; H03M 1/56
USPC ............... 348/241, 222.1, 572; 341/126, 155, 341/158, 169
See application file for complete search history.

(56) References Cited

U.S. PATENT DOCUMENTS

| | | | | |
|---|---|---|---|---|
| 5,877,715 | A * | 3/1999 | Gowda et al. ................. | 341/122 |
| 7,088,279 | B2 * | 8/2006 | Muramatsu et al. .......... | 341/155 |
| 7,129,883 | B2 * | 10/2006 | Muramatsu et al. .......... | 341/164 |
| 7,532,148 | B2 * | 5/2009 | Muramatsu et al. .......... | 341/169 |
| 7,586,431 | B2 * | 9/2009 | Muramatsu et al. .......... | 341/164 |
| 7,880,662 | B2 * | 2/2011 | Bogaerts ....................... | 341/169 |
| 7,973,695 | B2 * | 7/2011 | Kudo ............................. | 341/169 |
| 7,990,304 | B2 * | 8/2011 | Lim et al. ...................... | 341/164 |
| 8,072,522 | B2 * | 12/2011 | Taura ............................. | 348/300 |

(Continued)

FOREIGN PATENT DOCUMENTS

JP          2005-347931 A        12/2005

OTHER PUBLICATIONS

Toyama Takayuki et al, A 17.7 Mpixel 120fps CMOS Image Sensor with 34.8Gb/s Readout, ISSCC 2011, Session 23, Image Sensors 23.11, Feb. 23, 2011, pp. 420-421.

*Primary Examiner* — Nicholas Giles
(74) *Attorney, Agent, or Firm* — Westerman, Hattori, Daniels & Adrian, LLP

(57) ABSTRACT

A ramp section generates a reference signal. A comparison section compares an analog signal to the reference signal, and terminates a comparison process at a timing at which the reference signal has satisfied a predetermined condition for the analog signal. A main count section performs a count operation and outputs a count value. A latch section latches a second count value at a second timing related to the end of the comparison process corresponding to a second analog signal after latching a first count value at a first timing related to the end of the comparison process corresponding to a first analog signal. A column count section sequentially counts values of bits constituting the second count value retained in the latch section after an initial value has been set on the basis of values of bits constituting the first count value retained in the latch section.

8 Claims, 26 Drawing Sheets

(56) References Cited

U.S. PATENT DOCUMENTS

| | | | |
|---|---|---|---|
| 8,253,617 B2 * | 8/2012 | Bogaerts | 341/169 |
| 8,330,635 B2 * | 12/2012 | Hisamatsu | 341/155 |
| 8,395,539 B2 * | 3/2013 | Lim et al. | 341/169 |
| 8,421,888 B2 * | 4/2013 | Koseki | 348/243 |
| 8,476,568 B2 * | 7/2013 | Murakami et al. | 250/208.1 |
| 2008/0111059 A1 * | 5/2008 | Lee et al. | 250/214 DC |
| 2010/0194948 A1 * | 8/2010 | Murakami et al. | 348/302 |
| 2010/0225796 A1 * | 9/2010 | Lim et al. | 348/308 |
| 2010/0277632 A1 * | 11/2010 | Murakami et al. | 348/297 |
| 2011/0095929 A1 * | 4/2011 | Bogaerts | 341/169 |
| 2011/0122274 A1 * | 5/2011 | Itzhak et al. | 348/222.1 |
| 2011/0221942 A1 * | 9/2011 | Taura | 348/294 |

* cited by examiner

PRIOR ART

US 8,917,337 B2

AD CONVERSION CIRCUIT AND IMAGING APPARATUS

BACKGROUND OF THE INVENTION

1. Field of the Invention

The present invention relates to an analog-to-digital (AD) conversion circuit and an imaging apparatus having the same.

Priority is claimed on Japanese Patent Application No. 2011-132196, filed Jun. 14, 2011, the content of which is incorporated herein by reference.

2. Description of Related Art

As examples using an AD conversion circuit of the related art, configurations disclosed in Japanese Unexamined Patent Application, First Publication No. 2005-347931 and Takayuki Toyama et al., "A 17.7 Mpixel 120 fps CMOS Image Sensor with 34.8 Gb/s Readout," Sony, Kanagawa, Japan ISSCC2011/SESSION23/IMAGE SENSORS/23.11 are well known. First, a configuration and operation of the AD conversion circuit according to the example of the related art will be described.

FIG. 26 shows a configuration of a (complementary) metal oxide semiconductor ((C)MOS) imaging apparatus using an AD conversion circuit according to the related art. The imaging apparatus 1001 shown in FIG. 26 includes an imaging section 1002, a vertical selection section 1012, a read current source section 1005, an analog section 1006, a count section 1018, a ramp section 1019, a column processing section 1015, a horizontal selection section 1014, an output section 1017, and a control section 1020.

The control section 1020 controls parts such as the vertical selection section 1012, the read current source section 1005, the analog section 1006, the count section 1018, the ramp section 1019, the column processing section 1015, the horizontal selection section 1014, and the output section 1017. The imaging section 1002 is configured to include unit pixels 1003 having photoelectric conversion elements arranged in a matrix, to generate a pixel signal corresponding to the amount of an incident electromagnetic wave, and to output the generated pixel signal to a vertical signal line 1013 provided for every column.

The vertical selection section 1012 controls row addressing or row scanning of the imaging section 1002 via a row control line 1011 when each unit pixel 1003 of the imaging section 1002 is driven. The horizontal selection section 1014 controls column addressing or column scanning of a column AD conversion section 1016 of the column processing section 1015. The read current source section 1005 is a current source for reading a pixel signal from the imaging section 1002 as a voltage signal. The analog section 1006 performs amplification or the like, if necessary.

The column processing section 1015 includes the column AD conversion section 1016 configured of a comparison section 1109 and a latch section 1108 for each column of the unit pixels 1003. The column AD conversion section 1016 converts an analog signal, which is a pixel signal output from each unit pixel 1003 of the imaging section 1002 for each column, into digital data, and outputs the digital data. The count section 1018 counts a clock signal output from the control section 1020 as a count clock, and outputs a digital (binary) value indicating a count result.

The digital value output from the count section 1018 is input to the ramp section 1019. The ramp section 1019 generates a ramp wave that changes along a gradient with the passage of time according to the input digital value, and outputs the ramp wave as a reference signal to one of input terminals of the comparison section 1109. An output of the count section 1018 is distributed to the latch section 1108 of each column. A pixel signal is input as an analog signal to be subjected to AD conversion from the unit pixel 1003 to the other of the input terminals of the comparison section 1109 within each column AD conversion section 1016 via the vertical signal line 1013.

The horizontal selection section 1014 controls column addressing or column scanning of each column AD conversion section 1016 in the column processing section 1015. Thereby, digital data subjected to AD conversion is sequentially output to the output section 1017 via a horizontal signal line.

Next, an AD conversion operation according to the related art will be described. First, in synchronization with a clock signal input from the control section 1020, the ramp section 1019 starts the generation of a ramp wave simultaneously when the count section 1018 starts a count operation. A signal read from the unit pixel 1003 of each column and a common ramp wave of which the amplitude changes in synchronization with a count value of the count section 1018 are input to the comparison section 1109 of each column. In parallel with this, the count value of the count section 1018 is distributed to the latch section 1108.

If the magnitude relationship between two input signals for the comparison section 1109 of a certain column becomes reversed, a comparison output of the comparison section 1109 is inverted and the latch section 1108 of the column retains a count value of the count section 1018. According to the above operation, a signal read from a pixel is AD-converted into a value (digital value) retained in the latch section 1108.

Although the description of a specific operation of the unit pixel is omitted here, a reset level and a signal level are output from the unit pixel as is well known. In order to accurately acquire a digital value of a signal component (a signal for a difference between the reset level and the signal level), it is necessary to carry out a subtraction operation (correlated double sampling (CDS) process) on the reset level and the signal level in a digital region. To obtain a digital value of a signal component in the configuration of the example of the related art, after digital values of the reset level and the signal level have been retained in the latch section 1108 within the column section (column AD conversion section 1016) corresponding to each column of the unit pixels 1003, the subtraction operation (CDS process) on digital values of the reset level and the signal level is performed using an arithmetic device provided outside the column section.

Here, an imager for use in a digital still camera (DSC) or the like is considered as an example of a specific device. Specifically, specs in which the number of pixels is 2000 $10^4$ and a frame rate is 60 frames/sec are assumed. Assuming that a pixel array of 2000 $10^4$ pixels is designated as 4000 rows 5000 columns in length and width in order to facilitate description and a blanking period is absent for further simplicity, the number of rows from which pixel signals are read per second is as follows.

60 frames/sec 4000 rows/frame=240K lines/sec

That is, a read rate of one row becomes 240 KHz (about 4.2 sec). If a pixel signal is output via an output signal line of one system, the read rate is as follows.

240K lines/sec 5000 columns=1.2 GHz

That is, the data rate becomes about 1.2 GHz (about 0.8 nsec). In this calculation, because reading from optical black (OB) pixels or other dummy pixels is excluded, reading is

SUMMARY OF THE INVENTION

According to a first aspect of the present invention, an analog-to-digital (AD) conversion circuit includes a reference signal generation section configured to generate a reference signal that increases or decreases with the passage of time, a comparison section configured to compare an analog signal to be subjected to AD conversion output from a pixel of an image apparatus to the reference signal, and configured to terminate a comparison process at a timing at which the reference signal has satisfied a predetermined condition for the analog signal, a first count section configured to perform a count operation and outputting a count value, a latch section configured to latch a second count value at a second timing related to an end of the comparison process corresponding to a second analog signal after latching a first count value at a first timing related to an end of the comparison process corresponding to a first analog signal, and a second count section configured to sequentially count values of bits constituting the second count value retained in the latch section after an initial value has been set on the basis of values of bits constituting the first count value retained in the latch section. The AD conversion circuit outputs digital data corresponding to a difference between the first analog signal and the second analog signal. The latch section and the second count section are arranged for every column or every plurality of columns of a pixel array of the imaging apparatus.

Preferably, the initial value is an inversion count value obtained by inverting the values of the bits constituting the first count value.

Preferably, the initial value is an inversion count value obtained by further inverting a third count value after the third count value has been obtained by sequentially counting the values of the bits constituting the first count value.

In addition, according to a second aspect of the present invention, in the above-described AD conversion circuit, a count mode of the first count section includes a count-up mode and a count-down mode. The first count value is a count value counted in one of the count-up mode and the count-down mode. The second count value is a count value counted in the other of the count-up mode and the count-down mode.

In addition, according to a third aspect of the present invention, an imaging apparatus includes an imaging section in which a plurality of pixels having photoelectric conversion elements are arranged to output a signal corresponding to a reset level as a first analog signal and output a signal corresponding to an amount of an incident electromagnetic wave as a second analog signal, and the above-described AD conversion circuit.

DETAILED DESCRIPTION OF THE INVENTION

Hereinafter, embodiments of the present invention will be described with reference to the drawings.

First Embodiment

Figure 1:
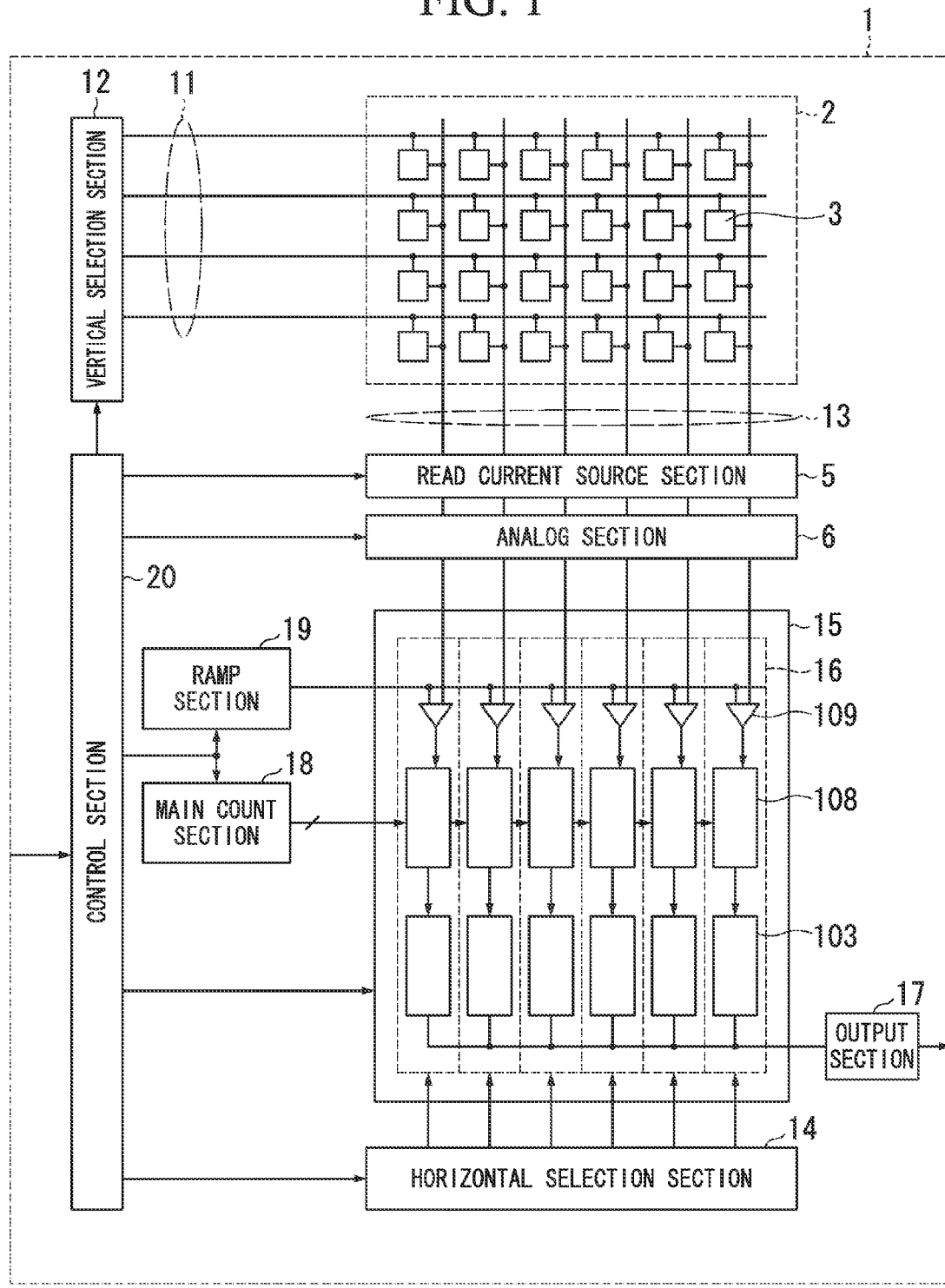
FIG. 1 is a block diagram showing a configuration of an imaging apparatus according to a first embodiment of the present invention.

First, a first embodiment of the present invention will be described. FIG. 1 shows an example of a configuration of a (C)MOS imaging apparatus according to this embodiment. The imaging apparatus 1 shown in FIG. 1 includes an imaging section 2, a vertical selection section 12, a read current source section 5, an analog section 6, a main count section 18 (first count section), a ramp section 19 (reference signal generation section), a column processing section 15, a horizontal selection section 14, an output section 17, and a control section 20.

The imaging section 2 includes a plurality of unit pixels 3 arranged in a matrix for generating and outputting a signal corresponding to the amount of an incident electromagnetic wave. The vertical selection section 12 selects each row of the imaging section 2. The read current source section 5 reads the signal from the imaging section 2 as a voltage signal. Although not described in detail, the analog section 6 has an auto gain control (AGC) circuit having a signal amplification function if necessary. The main count section 18 performs a count operation by designating a clock signal output from the control section 20 as a count clock, and outputs a count value, which is a digital (binary) value indicating a count result.

The ramp section 19 generates a reference signal (ramp wave) that increases or decreases with the passage of time. The column processing section 15 is connected to the ramp section 19 via a reference signal line. The horizontal selection section 14 reads data subjected to AD conversion to a horizontal signal line. The output section 17 is connected to the horizontal signal line. The control section 20 controls each part.

Although the imaging section 2 including unit pixels 3 of 4 rows 6 columns for simplicity has been described with reference to FIG. 1, several tens or several tens of thousands of unit pixels 3 are actually arranged in each row or column of the imaging section 2. Although not shown, the unit pixels 3 constituting the imaging section 2 include a photoelectric conversion element such as a photodiode/photogate/phototransistor and a transistor circuit.

Hereinafter, main parts will be described in further detail. In the imaging section 2, the unit pixels 3 are two-dimensionally arranged only in 4 rows and 6 columns, and a row control line 11 is wired for each row with respect to a pixel array of 4 rows and 6 columns. One end of the row control line 11 is connected to an output terminal corresponding to each row of the vertical selection section 12. The vertical selection section 12 is configured of a shift register or a decoder. The vertical selection section 12 controls row addressing or row scanning of the imaging section 2 via the row control line 11 when each unit pixel 3 of the imaging section 2 is driven. In addition, a vertical signal line 13 is wired for each column with respect to the pixel array of the imaging section 2.

The column processing section 15 has a column AD conversion section 16, for example, provided for each pixel column of the imaging section 2, that is, each vertical signal line 13. The column processing section 15 converts an analog pixel signal read from each unit pixel 3 of the imaging section 2 through the vertical signal line 13 for each pixel column into digital data. Although column AD conversion sections 16 are arranged to have a one-to-one correspondence relationship with pixel columns of the imaging section 2 in this embodiment, this is only an example and the present invention is not limited to this layout relationship. For example, one column AD conversion section 16 for a plurality of pixel columns can be arranged and the one column AD conversion section 16 can be used and configured in time division among a plurality of pixel columns. The column processing section 15 is an AD conversion means for converting an analog pixel signal read from a unit pixel 3 of a selected pixel row of the imaging section 2 into digital pixel data along with the ramp section 19 and the main count section 18 as will be described later. Details of the column AD conversion section 16 will be described later.

The ramp section 19 is configured of, for example, an integrating circuit. According to control of the control section 20, the ramp section 19 generates a ramp wave, the level of which changes along a gradient with the passage of time, and supplies the ramp wave to one of input terminals of a comparison section 109 via a reference signal line. The ramp section 19 is not limited to the integrating circuit, and a digital-to-analog converter (DAC) circuit may be used. However, in the case of a configuration in which a ramp wave is digitally generated using the DAC circuit, a configuration that makes the step of the ramp wave fine or a configuration equivalent thereto is necessary.

The horizontal selection section 14 is configured of a shift register or a decoder. The horizontal selection section 14 controls column addressing or column scanning of the column AD conversion section 16 of the column processing section 15. According to control of the horizontal selection section 14, digital data subjected to AD conversion by the column AD conversion section 16 is sequentially read to the horizontal signal line.

The main count section 18 is configured of a binary counter circuit having a count-down mode. The main count section 18 performs a count operation in the binary counter circuit, and outputs a count value. When the count value is configured of, for example, 6 bits, the main count section 18 outputs D[0], D[1], D[2], D[3], D[4], and D[5].

The output section 17 outputs digital data. The output section 17 may have embedded signal processing functions, for example, such as black level adjustment, column variation correction, color processing, and the like, in addition to a buffering function.

Further, n-bit parallel digital data may be converted into serial data and the serial data may be output.

The control section 20 includes a functional block of a timing generator (TG), which supplies predetermined timing pulse signals or clocks necessary for operations of parts such as the ramp section 19, the main count section 18, the vertical selection section 12, the horizontal selection section 14, and the output section 17, and a functional block for communicating with the TG.

Next, a configuration of the column AD conversion section 16 will be described. The column AD conversion section 16 generates a pulse signal having the magnitude (pulse width) of a time axis direction corresponding to each amount of the reset level (reference level) or the signal level by comparing an analog pixel signal read from each unit pixel 3 of the imaging section 2 via the vertical signal line 13 to a ramp wave for AD conversion provided from the ramp section 19. The AD conversion is performed by generating digital data according to the amount of a pixel signal from data corresponding to a period of a pulse width of the pulse signal.

Hereinafter, details of a configuration of the column AD conversion section 16 will be described. The column AD conversion section 16 is provided for each column. In FIG. 1, six column AD conversion sections 16 are provided. The column AD conversion sections 16 of the columns have the same configuration. The column AD conversion section 16 is configured of a comparison section 109, a latch section 108, and a column count section 103 (second count section). Here, the column count section 103 is assumed to be a binary counter circuit having a latch function of retaining a logical state.

The comparison section 109 converts the amount of the pixel signal into information of a time axis direction (a pulse width of a pulse signal) by comparing a signal voltage corresponding to an analog pixel signal output from the unit pixel 3 of the imaging section 2 via the vertical signal line 13 to a ramp wave (ramp voltage) supplied from the ramp section 19. A comparison output of the comparison section 109 has a High level (H level), for example, when a ramp voltage is greater than a signal voltage, and has a Low level (L level) when the ramp voltage is less than or equal to the signal voltage.

The latch section 108 receives a comparison output of the comparison section 109 and latches (retains/stores) a count value output from the main count section 18 at the timing when the comparison output is inverted. The column count section 103 performs a subtraction operation (CDS process) based on the count value latched in the latch section 108.

Here, the count value latched in the latch section 108 is, for example, 6-bit data. In this case, the column count section 103 is configured of a 6-bit counter circuit. However, this is an example, and the present invention is not limited thereto.

Next, an operation of this embodiment will be described. Although the description of a specific operation of the unit pixel 3 is omitted here, a reset level and a signal level are output from the unit pixel 3 as is well known.

The AD conversion is performed as follows. For example, a ramp wave, which falls with a predetermined slope, is compared to each voltage of a certain reset level or signal level in a pixel signal from the unit pixel 3. A count value corresponding to a period until each voltage of the reset level or the signal level is consistent with a ramp wave (ramp voltage) from when a ramp wave to be used in the comparison process has been generated is retained in the latch section 108. Thereby, digital data corresponding to each amount of the reset level or the signal level is obtained.

Here, the reset level including noise of a pixel signal is read in a first read operation from each unit pixel 3 of a selected row of the imaging section 2 as an analog pixel signal, and then the signal level is read in a second read operation. The reset level and the signal level are input in time series to the column AD conversion section 16 through the vertical signal line 13. However, the signal level may be read in the first read operation and the reset level may be read in the subsequent second read operation. Hereinafter, the first and second read operations and the subsequent subtraction operation (CDS process) will be described in detail. Here, the count mode of the main count section 18 is a count-down mode, the count mode of the column count section 103 is a count-up mode, and the main count section 18 and the column count section 103 perform a count operation at the timing of a falling edge of a count clock.

<First Read>

After the first read operation from the unit pixels 3 of an arbitrary pixel row to the vertical signal line 13 has been stabilized, the control section 20 supplies control data of ramp wave generation to the ramp section 19. The ramp section 19 receives the control data, and outputs a ramp wave, the waveform of which temporally changes in a ramp shape as a whole, as a comparison voltage to be provided to one input terminal of the comparison section 109. The comparison section 109 compares the ramp wave to the reset level. Meanwhile, the main count section 18 performs a count operation in the count-down mode, and outputs a count value. Although it is preferable that the timing of a count operation start in the main count section 18 be approximately simultaneous with the timing of a ramp wave output start, the present invention is not limited thereto.

The comparison section 109 compares the ramp wave provided from the ramp section 19 to the reset level, and inverts a comparison output when voltages of the two are approximately consistent (a first timing). At this first timing, the latch section 108 retains a count value output from the main count section 18 as a first count value. When a predetermined period has elapsed, the control section 20 stops the supply of control data to the ramp section 19 and the count operation of the main count section 18. Thereby, the ramp section 19 stops ramp wave generation.

Subsequently, each bit constituting the first count value retained in the latch section 108 is set to each bit of the column count section 103. Thereafter, a value of each bit of the column count section 103 is inverted. Thereby, an initial value of the column count section 103 is set.

<Second Read>

Subsequently, during the second read operation, a signal level corresponding to an amount of incident light of each unit pixel 3 is read and an operation similar to the first read operation is performed. After the second read operation from the unit pixels 3 of an arbitrary pixel row to the vertical signal line 13 has been stabilized, the control section 20 supplies control data of ramp wave generation to the ramp section 19. The ramp section 19 receives the control data, and outputs a ramp wave, the waveform of which temporally changes in a ramp shape as a whole, as a comparison voltage to be provided to one input terminal of the comparison section 109. The comparison section 109 compares the ramp wave to the signal level. Meanwhile, the main count section 18 performs a count operation in the count-down mode, and outputs a count value. Although it is preferable that the timing of a count operation start in the main count section 18 be approximately simultaneous with the timing of a ramp wave output start, the present invention is not limited thereto.

The comparison section 109 compares the ramp wave provided from the ramp section 19 to the signal level, and inverts a comparison output when voltages of the two are approximately consistent (a second timing). At this second timing, the latch section 108 retains a count value output from the main count section 18 as a second count value. When a predetermined period has elapsed, the control section 20 stops the supply of control data to the ramp section 19 and the count operation of the main count section 18. Thereby, the ramp section 19 stops ramp wave generation.

Subsequently, the column count section 103 sequentially performs an addition operation on bits constituting the second count value retained in the latch section 108. Thereby, a subtraction operation (CDS process) on the first count value and the second count value is performed. As described above, digital data corresponding to a difference between the reset level and the signal level is obtained. Finally, each bit value constituting digital data retained by the column count section 103 is inverted, and the inverted value is transferred by the horizontal selection section 14 to the output section 17 via the horizontal signal line.

Figure 2:
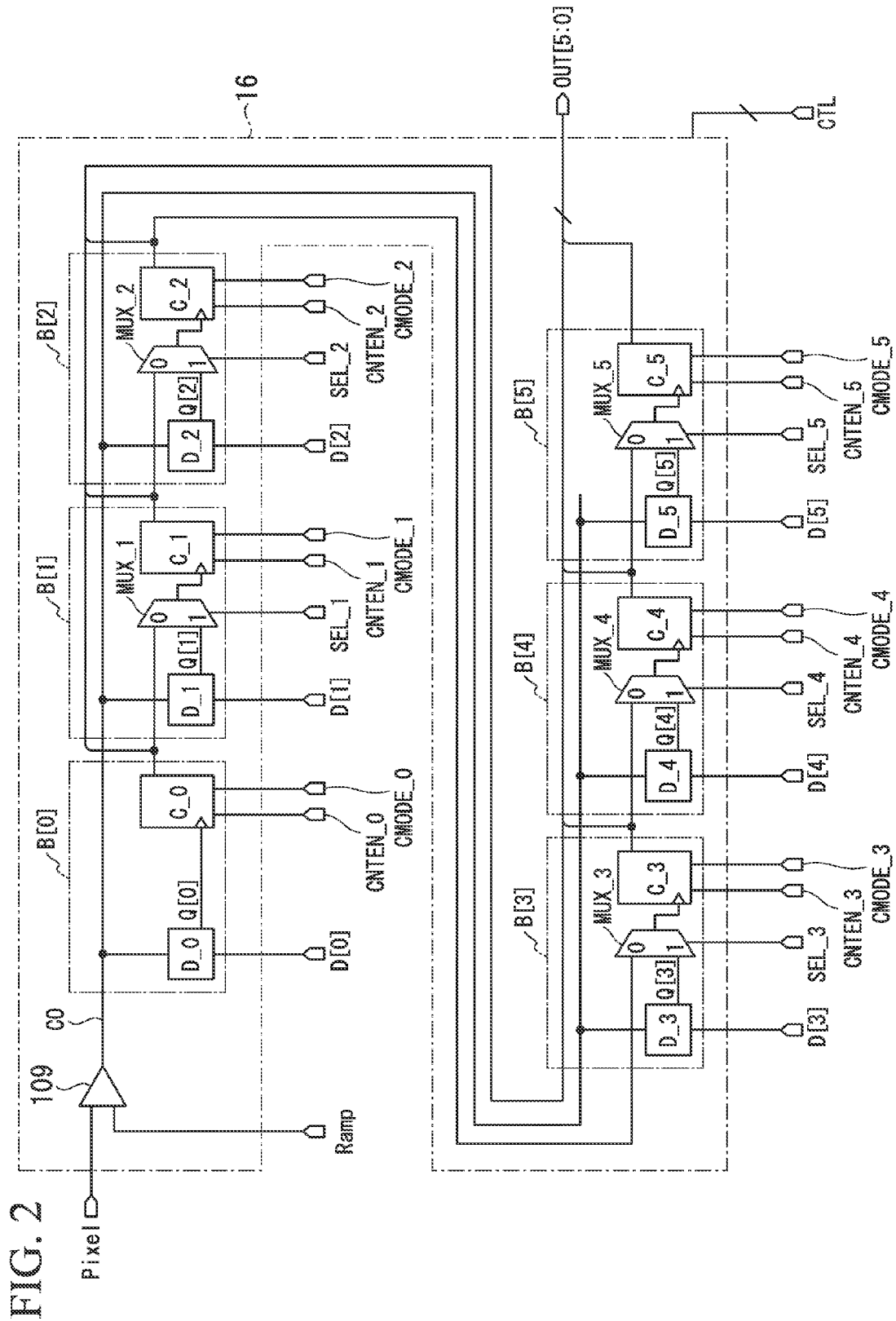
FIG. 2 is a block diagram showing a column AD conversion section according to the first embodiment of the present invention.

Next, each configuration of the column AD conversion section 16 will be described in detail. FIG. 2 shows an example of a detailed configuration for further describing the column AD conversion section 16 of FIG. 1. Hereinafter, the configuration shown in FIG. 2 will be described. Each configuration shown in FIG. 2 corresponds to a configuration within the column AD conversion section 16 shown in FIG. 1. The comparison section 109, latch circuits D_0 to D_5 constituting the latch section 108, and switching sections MUX_1 to MUX_5 and counter circuits C_0 to C_5 constituting the column count section 103 are provided in the column AD conversion section 16. In this embodiment, the case in which a 6-bit latch circuit and a 6-bit counter circuit are used will be described. A circuit B[*] (* is an integer of 0 to 5) corresponding to each bit is configured of a latch circuit D_*, a switching section MUX_*, and a counter circuit C_* as basic units. Only in a circuit B[0] corresponding to a least significant bit, are the latch circuit D_0 and the counter circuit C_0 configured as basic units. The ramp section 19 and the main count section 18 of FIG. 1 and the column AD conversion section 16 shown in FIG. 2 are an example of an AD conversion circuit of the present invention.

The latch circuits D_0 to D_5 latch count values D[0] to D[5] output from the main count section 18 on the basis of a comparison output CO of the comparison section 109. The counter circuits C_0 to C_5 perform count operations based on bit values retained in the latch circuits D_0 to D_5. The switching sections MUX_1 to MUX_5 switch signals input to the counter circuits C_1 to C_5 as count clocks between outputs of the counter circuit C_0 to C_4 and outputs of the latch circuits D_1 to D_4.

Control signals CNTEN_0 to CNTEN_5 and control signals CMODE_0 to CMODE_5 are input to the counter circuits C_0 to C_5. The control signals CNTEN_0 to CNTEN_5 are signals used to set values retained in the latch circuits D_0 to D_5 in the counter circuits C_0 to C_5. The control signals CMODE_0 to CMODE_5 are signals used to switch operations of the counter circuits C_0 to C_5 between the count mode in which the count operation is performed and a data protection mode in which the count operation is stopped and the count value is protected. In this embodiment, a flag counter circuit for determining a positive/negative value may be provided in the column count section 103. Details of the counter circuits C_0 to C_5 will be described with reference to FIG. 10. Control signals SEL_1 to SEL_5 are input to the switching sections MUX_1 to MUX_5. The control signals SEL_1 to SEL_5 are signals used to switch signals input to the counter circuits C_1 to C_5.

Next, an operation of the configuration shown in FIG. 2 will be described using a specific example. Hereinafter, the case in which a 6-bit down counter circuit is used as the main count section 18 and a 6-bit up counter circuit is used as the column count section 103 will be described. When the count operation has been performed in the count-down mode, a count value becomes 6'b00_000 (corresponding to 0), for example, if 0 is counted, and a count value becomes 6'b11_1001 (corresponding to −7), for example, if 7 is counted. When the count operation has been performed in the count-up mode, a count value becomes 6'b00_0000 (corresponding to 0), for example, if 0 is counted, and a count value becomes 6'b00_0111 (corresponding to 7), for example, if 7 is counted.

The notation of the above-described count value will be described. "6'b" indicates that the count value is a 6-bit binary number. "00_0000" indicates a count value of the main count section 18. The same notation is also used for a count value of the column count section 103.

Figure 3:
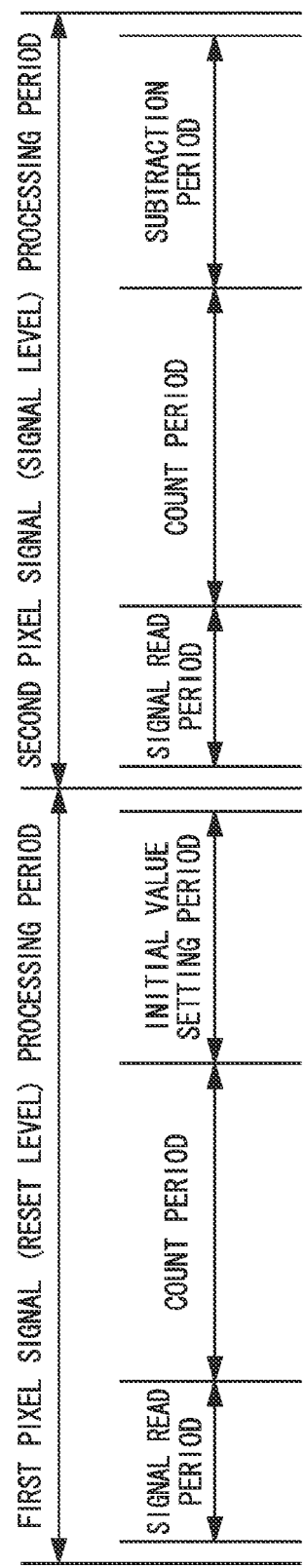
FIG. 3 is a reference diagram showing a signal processing period related to AD conversion according to the first embodiment of the present invention.

Hereinafter, an example in which a subtraction operation (CDS process) on a first pixel signal (reset level) and a second pixel signal (signal level) subsequent thereto is performed will be described. FIG. 3 schematically shows a signal processing period related to the AD conversion according to this embodiment. The AD conversion according to this embodiment is divided into a first pixel signal processing period in which the first pixel signal is processed and a second pixel signal processing period in which the second pixel signal is processed for execution. The first pixel signal processing period includes a signal read period in which the first pixel signal is read from the unit pixel 3, a count period in which the main count section 18 performs a count operation according to the first pixel signal, and an initial value setting period in which a count value of the main count section 18 is set to an initial value of the column count section 103. The second pixel signal processing period includes a signal read period in which the second pixel signal is read from the unit pixel 3, a count period in which the main count section 18 performs a count operation according to the second pixel signal, and a subtraction period in which a subtraction operation on the first and second pixel signals is performed when the column count section 103 performs a count operation according to the count value of the main count section 18.

In this embodiment, a binary subtraction operation using a 2's complement number is performed. Assuming that a digital value obtained by converting the first pixel signal according to AD conversion is A and a digital value obtained by converting the second pixel signal according to AD conversion is B, a subtraction result becomes B−A. Because the main count section 18 performs a count operation in the count-down mode, a count result (first count value) of the main count section 18 in the count period of the first pixel signal processing period is −A and a count result (second count value) of the main count section 18 in the count period of the second pixel signal processing period is −B. A value of A obtained by inverting the sign of the first count value is set to the initial value of the column count section 103. As a subtraction result, B-A can be obtained by inverting the sign after adding the second count value of −B to A.

FIGS. 4 to 9 illustrate waveforms of signals during the first and second read operations. In FIGS. 4 to 9, Q[0] to Q[5] indicate outputs of the latch circuits D_0 to D_5 of the column count section 103 and OUT[0] to OUT[5] indicate outputs of the counter circuits C_0 to C_5 of the column count section 103. Here, the case in which a count value for the first pixel signal is 31 and a count value for the second pixel signal is 43 and a value of 12 is obtained by subtraction (CDS process) of the first pixel signal from the second pixel signal will be described.

<<First Read>>

Figure 4:
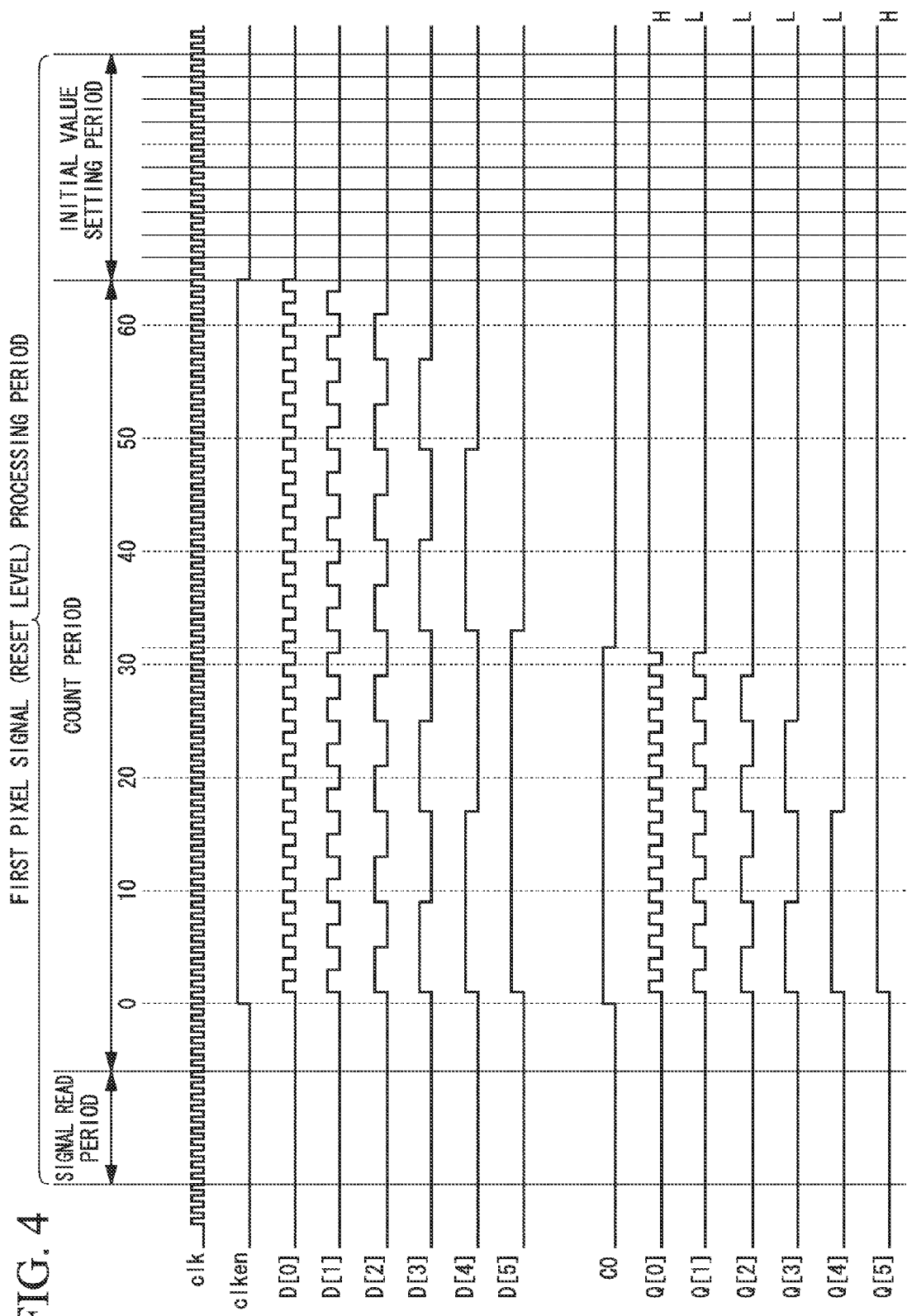
FIG. 4 is a timing chart showing an operation of a column AD conversion section according to the first embodiment of the present invention.
Figure 5:
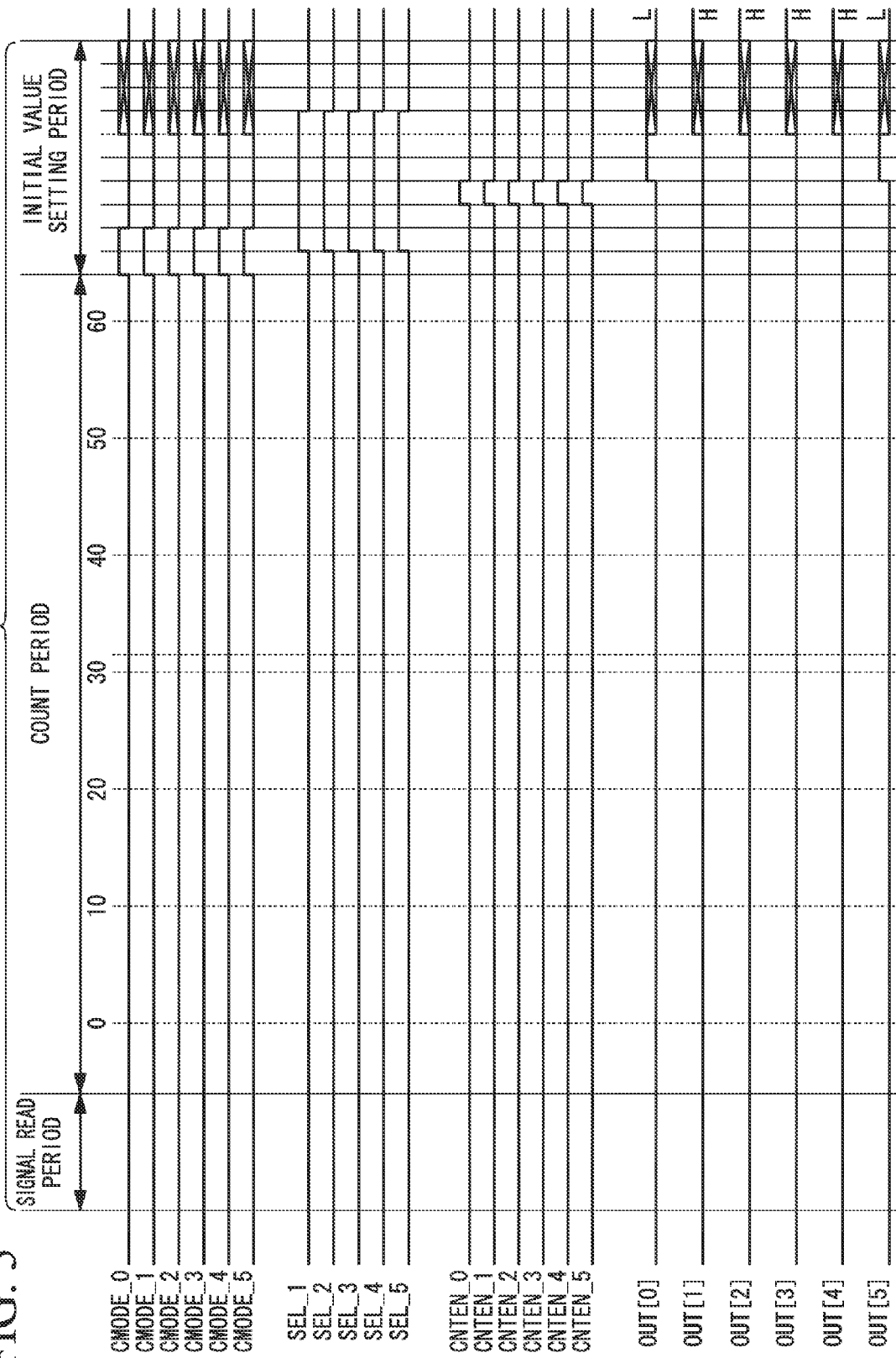
FIG. 5 is a timing chart showing an operation of the column AD conversion section according to the first embodiment of the present invention.

FIGS. 4 and 5 show operations of the signal read period, the count period, and the initial value setting period related to the first pixel signal. It is assumed that the control signals SEL_1 to SEL_5 are in the L state, the control signals CNTEN_0 to CNTEN_5 are in the L state, and the control signals CMODE_0 to CMODE_5 are in the L state. Because the control signals SEL_1 to SEL_5 are in the L state, the switching sections MUX_1 to MUX_5 select outputs of the counter circuits C_0 to C_4. Because the control signals CMODE_0 to CMODE_5 are in the L state, operation modes of the counter circuit C_0 to C_5 are set to the count mode. In addition, the counter circuits C_0 to C_5 and the latch circuits D_0 to D_5 are reset according to control signals (not shown).

At the initiation of the comparison process, a value retained by the latch section 108 is 6'b00_0000 (corresponding to 0) and a value retained by the column count section 103 is 6'b00_0000 (corresponding to 0). After the first read operation from the unit pixels 3 of an arbitrary pixel row to the vertical signal line 13 has been stabilized in the signal read period, a count enable signal clken from the control section 20 to the main count section 18 changes from the L state to the H state simultaneously when the ramp section 19 starts an output of a ramp wave in the count period, and the main count section 18 starts an operation of counting a clock signal clk from the control section 20.

Subsequently, at a first timing at which a predetermined condition is satisfied (the first timing related to a comparison between the ramp wave provided from the ramp section 19 and the reset level in the above-described operation), a comparison output CO is inverted and outputs D[0] to D[5] from the main count section 18 are retained in the latch section 108 at the time (a first count value). At this time, a value retained by the latch section 108 is 6'b10_0001 (corresponding to −31) and a value retained by the column count section 103 is 6'b00_0000 (corresponding to 0).

After the count enable signal clken from the control section 20 to the main count section 18 has the L state and the count period ends, values of bits constituting the first count value retained in the latch section 108 are set to bits of the counter circuits C_0 to C_5 constituting the column count section 103 in the initial value setting period. Specifically, after the control signals CMODE_0 to CMODE_5 have changed from being in the L state to being in the H state, the control signals SEL_1 to SEL_5 change from being in the L state to being in the H state and the control signals CMODE_0 to CMODE_5 further change from being in the H state to being in the L state. That is, after operation modes of the counter circuits C_0 to C_5 have been set to the data protection mode, the switching sections MUX_1 to MUX_5 select outputs of the latch circuits D_1 to D_5 and the operation modes of the counter circuits C_0 to C_5 are further set to the count mode.

Subsequently, the control signals CNTEN_0 to CNTEN_5 change from being in the L state to being in the H state and further change to being in the L state. Thereby, the first count value retained in the latch section 108 is retained in the column count section 103. At this time, the value retained by the latch section 108 is 6'b10_0001 (corresponding to −31) and the value retained by the column count section 103 is 6'b10_0001 (corresponding to −31).

Thereafter, the value retained in the column count section 103 is inverted. At this time, the value retained by the latch section 108 is 6'b10_0001 (corresponding to −31) and the value retained by the column count section 103 is 6'b01_1110 (corresponding to 30). By adding 1 after inverting the value, a value obtained by inverting the sign of the value retained in the latch section 108 can be set to the initial value of the column count section 103. However, as will be described later, because value inversion is also performed during the second read operation, a value change by adding 1 after each inversion is canceled. Accordingly, in this embodiment, 1 is not added after the value inversion.

<<Second Read>>

Figure 6:
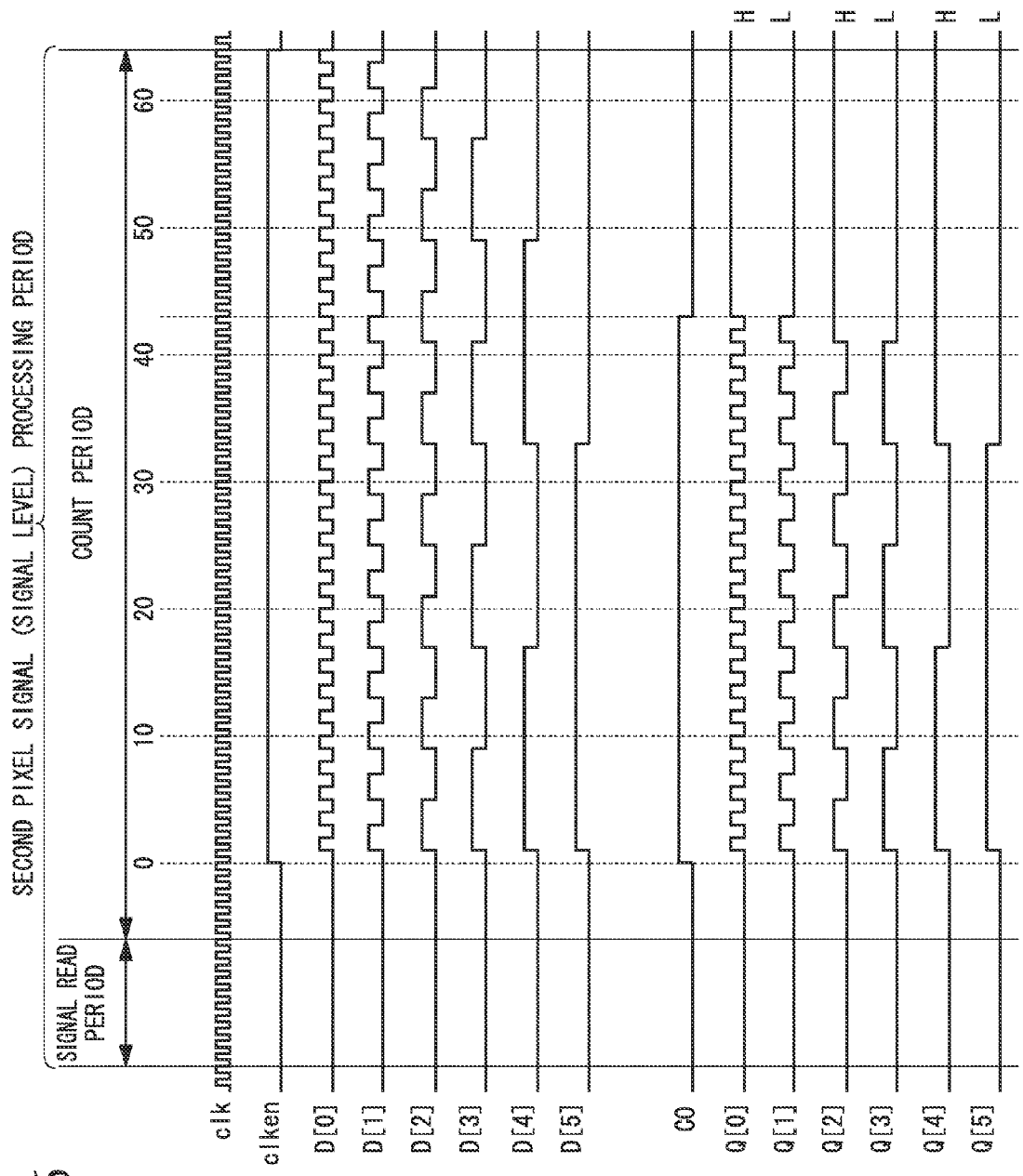
FIG. 6 is a timing chart showing an operation of the column AD conversion section according to the first embodiment of the present invention.
Figure 7:
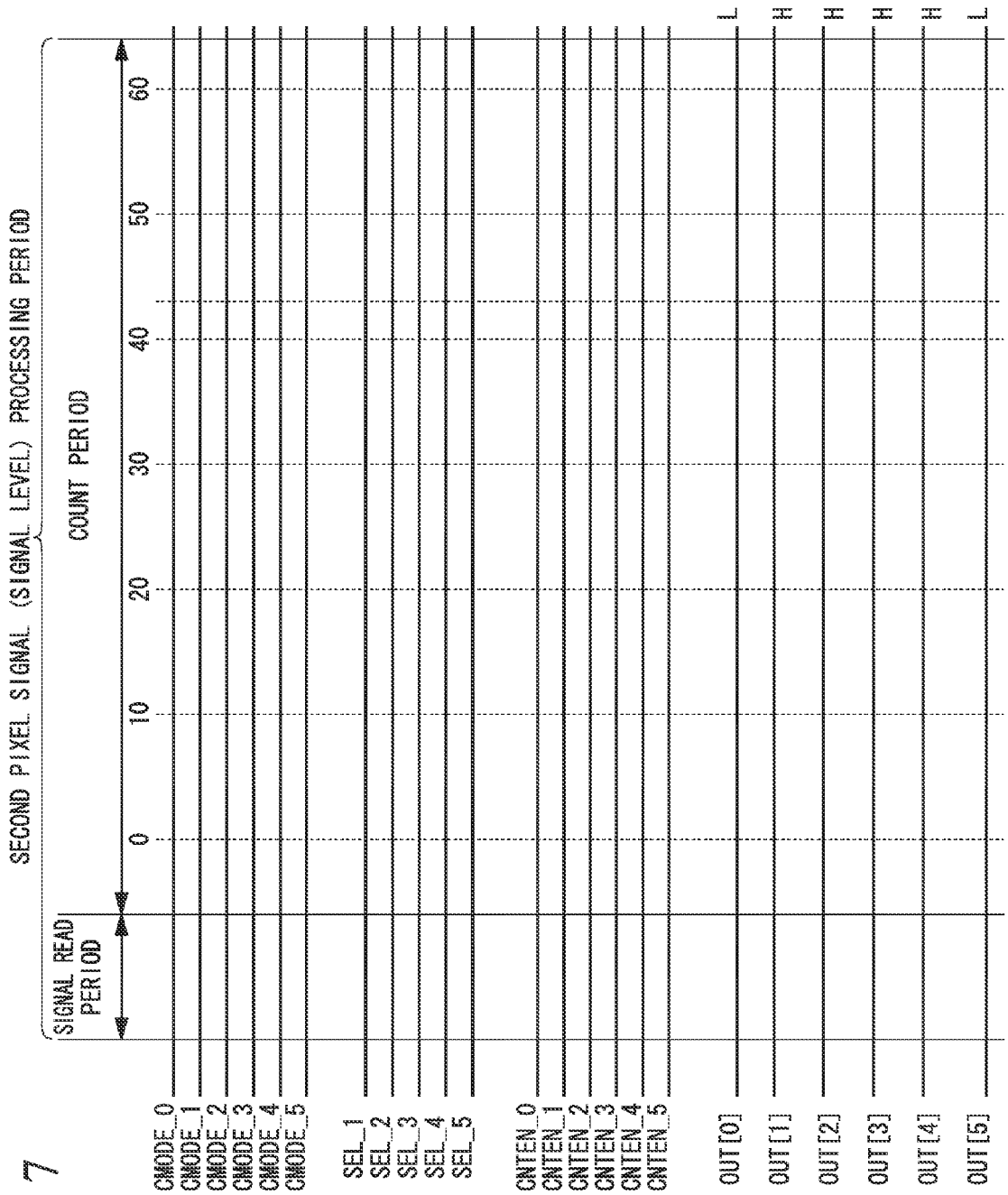
FIG. 7 is a timing chart showing an operation of the column AD conversion section according to the first embodiment of the present invention.

FIGS. 6 and 7 show operations of the signal read period and the count period related to the second pixel signal. The control signals SEL_1 to SEL_5 are in the L state, the control signals CNTEN_0 to CNTEN_5 are in the L state, and the control signals CMODE_0 to CMODE_5 are in the L state. Because the control signals SEL_1 to SEL_5 are in the L state, the switching sections MUX_1 to MUX_5 select outputs of the counter circuits C_0 to C_4. Because the control signals CMODE_0 to CMODE_5 are in the L state, the operation modes of the counter circuit C_0 to C_5 are set to the count mode.

However, the counter circuits C_0 to C_5 are not reset.

At the initiation of the comparison process, a value retained by the latch section 108 is 6'b00_0000 (corresponding to 0) and a value retained by the column count section 103 is 6'b01_1110 (corresponding to 30). After the second read operation from the unit pixels 3 of an arbitrary pixel row to the vertical signal line 13 has been stabilized in the signal read period, a count enable signal clken from the control section 20 to the main count section 18 changes from being in the L state to being in the H state simultaneously when the ramp section 19 starts an output of a ramp wave in the count period, and the main count section 18 starts an operation of counting a clock signal clk from the control section 20.

Subsequently, at a second timing at which a predetermined condition is satisfied (the second timing related to a comparison between the ramp wave provided from the ramp section 19 and the reset level in the above-described operation), a comparison output CO is inverted and outputs D[0] to D[5] from the main count section 18 are retained in the latch section 108 at the time (a second count value). At this time, a value retained by the latch section 108 is 6'b01_0101 (corresponding to −43) and a value retained by the column count section 103 is 6'b01_1110 (corresponding to 30).

Figure 8:
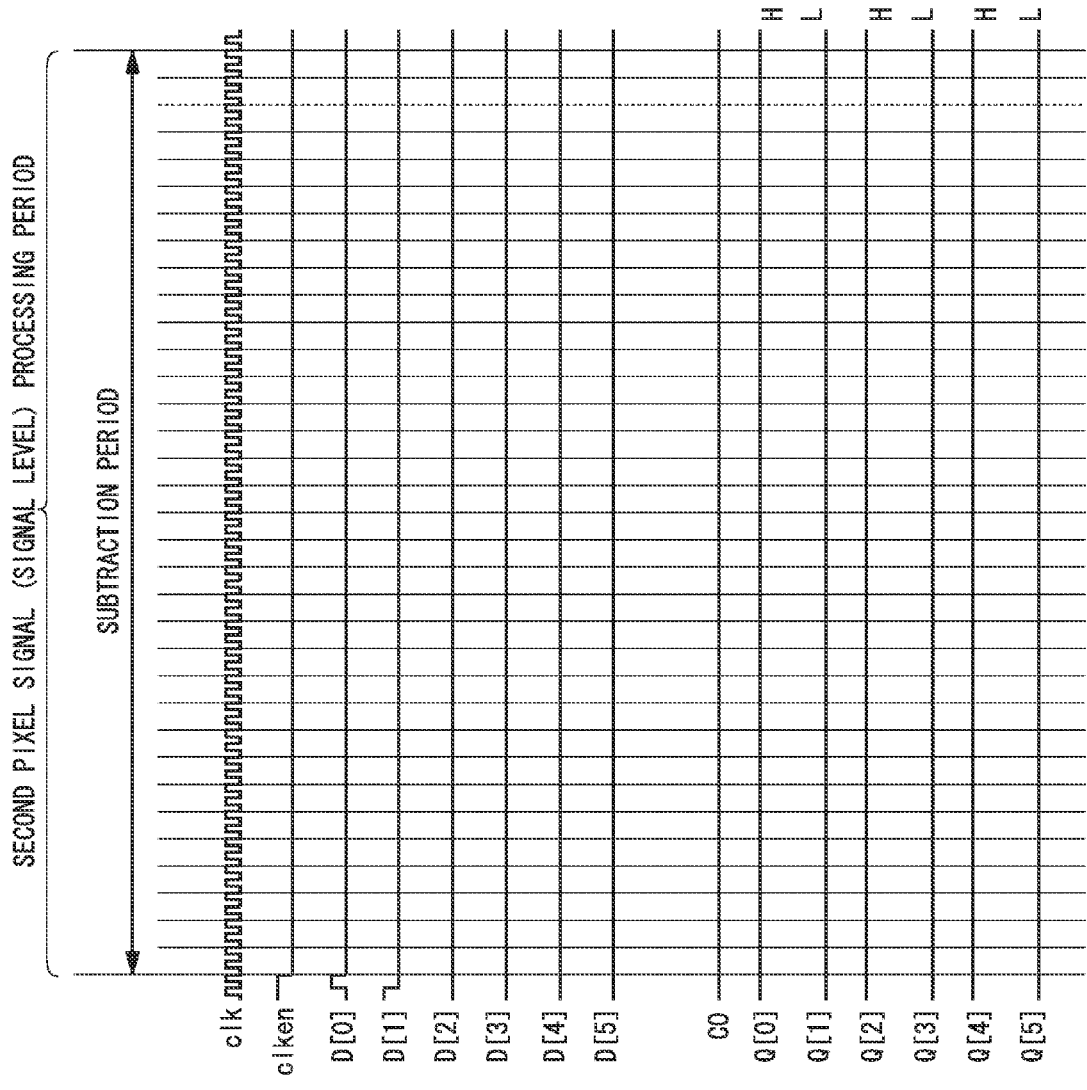
FIG. 8 is a timing chart showing an operation of the column AD conversion section according to the first embodiment of the present invention.
Figure 9:
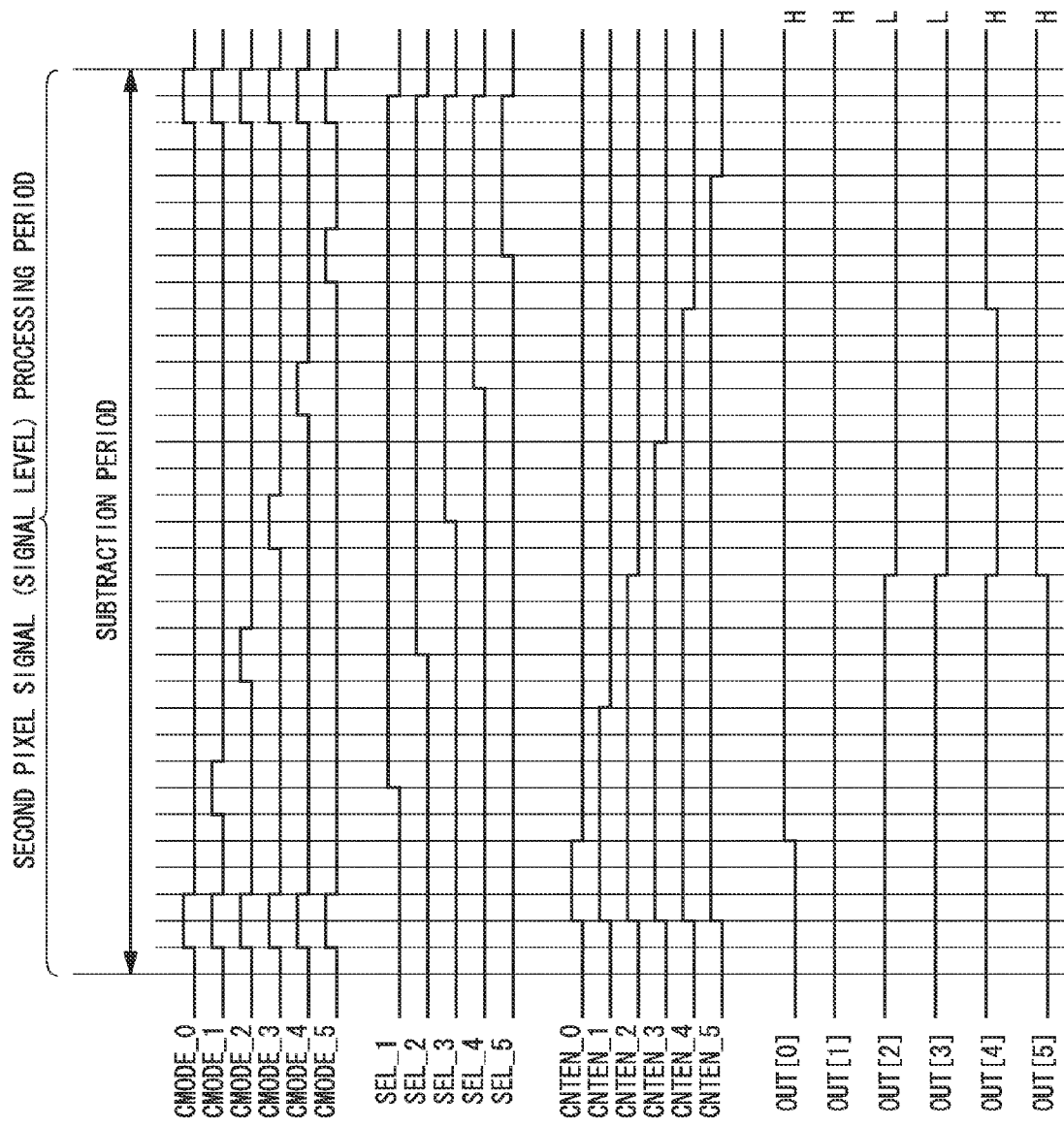
FIG. 9 is a timing chart showing an operation of the column AD conversion section according to the first embodiment of the present invention.

Subsequently, in the subtraction period, the column count section 103 sequentially performs an addition operation on bits constituting the second count value retained in the latch section 108. FIGS. 8 and 9 illustrate an operation of the subtraction period related to the second pixel signal. After the control signals CMODE_0 to CMODE_5 have changed from being in the L state to being in the H state and operations modes of the counter circuits C_0 to C_5 have been set to the data protection mode, the control signals CNTEN_0 to CNTEN_5 change from being in the L state to being in the H state. Subsequently, the control signals CMODE_0 to CMODE_5 change from being in the H state to being in the L state, and operation modes of the counter circuits C_0 to C_5 are set to the count mode. Thereby, the output Q[0] of the latch circuit D_0 is input to the counter circuit C_0 and also the outputs of the counter circuits C_0 to C_4 are input to the counter circuits C_1 to C_5, respectively. Thereafter, the control signal CNTEN_0 changes from being in the H state to being in the L state. Thereby, a value (1'b1) retained by the latch circuit D_0 is added. At this time, the value retained by the latch section 108 is 6'b01_0101 (corresponding to −43) and the value retained by the column count section 103 is 6'b01_1111.

Subsequently, the control signal CMODE_1 changes from being in the L state to being in the H state, and the operation mode of the counter circuit C_1 becomes the data protection mode. Further, after the control signal SEL_1 has changed from being in the L state to being in the H state, the control signal CMODE_1 changes from being in the H state to being in the L state. That is, after the switching section MUX_1 has selected an output of the latch circuit D_1, the operation mode of the counter circuit C_1 becomes the count mode. Because the control signals CNTEN_1 to CNTEN_5 are in the H state, the output Q[1] of the latch circuit D_1 is input to the counter circuit C_1 and also the outputs of the counter circuits C_1 to C_4 are input to the counter circuits C_2 to C_5, respectively. Thereafter, the control signal CNTEN_1 changes from being in the H state to being in the L state. Thereby, a value (1'b0) retained by the latch circuit D_1 is added. At this time, the value retained by the latch section 108 is 6'b01_0101 (corresponding to −43) and the value retained by the column count section 103 is 6'b01_1111.

Subsequently, the control signal CMODE_2 changes from being in the L state to being in the H state, and the operation mode of the counter circuit C_2 becomes the data protection mode. Further, after the control signal SEL_2 has changed from being in the L state to being in the H state, the control signal CMODE_2 changes from the H state to the L state. That is, after the switching section MUX_2 has selected an output of the latch circuit D_2, the operation mode of the counter circuit C_2 becomes the count mode. Because the control signals CNTEN_2 to CNTEN_5 are in the H state, the output Q[2] of the latch circuit D_2 is input to the counter circuit C_2 and also the outputs of the counter circuits C_2 to C_4 are input to the counter circuits C_3 to C_5, respectively. Thereafter, the control signal CNTEN_2 changes from being in the H state to being in the L state. Thereby, a value (1'b1) retained by the latch circuit D_2 is added. At this time, the value retained by the latch section 108 is 6'b01_0101 (corresponding to −43) and the value retained by the column count section 103 is 6'b10_0011.

Subsequently, the control signal CMODE_3 changes from being in the L state to being in the H state, and the operation mode of the counter circuit C_3 becomes the data protection mode. Further, after the control signal SEL_3 has changed from being in the L state to being in the H state, the control signal CMODE_3 changes from being in the H state to being in the L state. That is, after the switching section MUX_3 has selected an output of the latch circuit D_3, the operation mode of the counter circuit C_3 becomes the count mode. Because the control signals CNTEN_3 to CNTEN_5 are in the H state, the output Q[3] of the latch circuit D_3 is input to the counter circuit C_3 and also the outputs of the counter circuits C_3 and C_4 are input to the counter circuits C_4 and C_5, respectively. Thereafter, the control signal CNTEN_3 changes from being in the H state to being in the L state. Thereby, a value (1'b0) retained by the latch circuit D_3 is added. At this time, the value retained by the latch section 108 is 6'b01_0101 (corresponding to −43) and the value retained by the column count section 103 is 6'b10_0011.

Subsequently, the control signal CMODE_4 changes from being in the L state to being in the H state, and the operation mode of the counter circuit C_4 becomes the data protection mode. Further, after the control signal SEL_4 has changed from the L state to the H state, the control signal CMODE_4 changes from the H state to the L state. That is, after the switching section MUX_4 has selected an output of the latch circuit D_4, the operation mode of the counter circuit C_4 becomes the count mode. Because the control signals CNTEN_4 and CNTEN_5 are in the H state, the output Q[4] of the latch circuit D_4 is input to the counter circuit C_4 and also the output of the counter circuit C_4 is input to the counter circuit C_5. Thereafter, the control signal CNTEN_4 changes from being in the H state to being in the L state. Thereby, a value (1'b1) retained by the latch circuit D_4 is added. At this time, the value retained by the latch section 108 is 6'b01_0101 (corresponding to −43) and the value retained by the column count section 103 is 6'b11_0011.

Subsequently, the control signal CMODE_5 changes from being in the L state to being in the H state, and the operation mode of the counter circuit C_5 becomes the data protection mode. Further, after the control signal SEL_5 has changed from being in the L state to being in the H state, the control signal CMODE_5 changes from the H state to the L state. That is, after the switching section MUX_5 has selected an output of the latch circuit D_5, the operation mode of the counter circuit CS becomes the count mode. Because the control signal CNTEN_5 is in the H state, the output Q[5] of the latch circuit D_5 is input to the counter circuit C_5. Thereafter, the control signal CNTEN_5 changes from being in the H state to being in the L state. Thereby, a value (1'b0) retained by the latch circuit D_5 is added. At this time, the value retained by the latch section 108 is 6'b01_0101 (corresponding to −43) and the value retained by the column count section 103 is 6'b11_0011 (corresponding to −13).

Finally, the count value of the column count section 103 is inverted (although omitted from FIG. 8). At this time, the value retained by the latch section 108 is 6'b01_0101 (corresponding to −43) and the value retained by the column count section 103 is 6'b00_1100 (corresponding to 12). Because value inversion is also made during the first read operation and 1 is not added as described above, 1 is not added after the value inversion in this embodiment.

Digital data after the subtraction operation (CDS process) on the first count value and the second count value is transferred by the horizontal selection section 14 to the output section 17 via the horizontal signal line. However, the inversion of the digital data during the second read operation may also be performed after the digital data has been transferred to the output section 17. According to the above-described operation, binary data corresponding to a difference between the first pixel signal and the second pixel signal is obtained.

Figure 10:
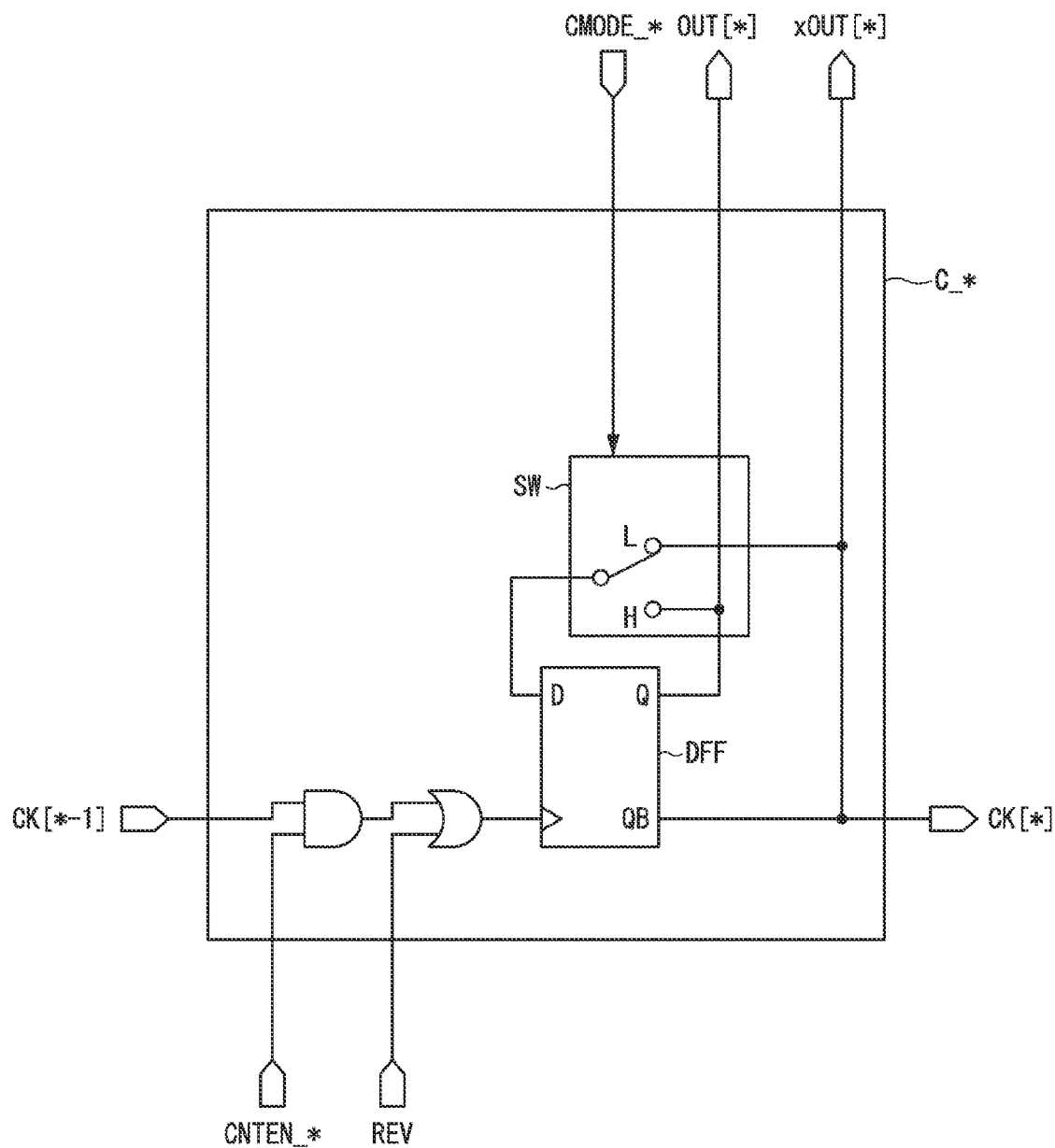
FIG. 10 is a circuit diagram showing a configuration of a binary counter circuit according to the first embodiment of the present invention.

Next, details of a binary counter circuit used for the column count section 103 will be described. FIG. 10 shows an example of a configuration of a 1-bit counter circuit C_* (*: 0 to 5) constituting the column count section 103. The counter circuit C_* shown in FIG. 10 includes a flip-flop circuit DFF, an AND circuit AND1, an OR circuit OR1, and a switching switch SW.

The flip-flop circuit DFF is configured of a D flip-flop. The AND circuit AND1 outputs, for example, a count pulse in an addition/subtraction operation, or, for example, a pulse for enabling/disabling a count clock in an inversion operation, by carrying out an AND operation on an output signal CK[*−1] of the previous-stage counter circuit C_* and a control signal CNTEN_*. The OR circuit OR1 generates a pulse for inverting a bit by carrying out an OR operation on an output signal of the AND circuit AND1 and a control signal REV. In order to protect a bit value, the switching switch SW switches a state in which an input terminal D has been connected to an output terminal Q and a state in which the input terminal D has been connected to an inversion output terminal QB on the basis of the control signal CMODE_*. When n counter circuits C_* are connected, an n-bit counter circuit is configured. However, this configuration is an example, and the present invention is not limited thereto.

Figure 11:
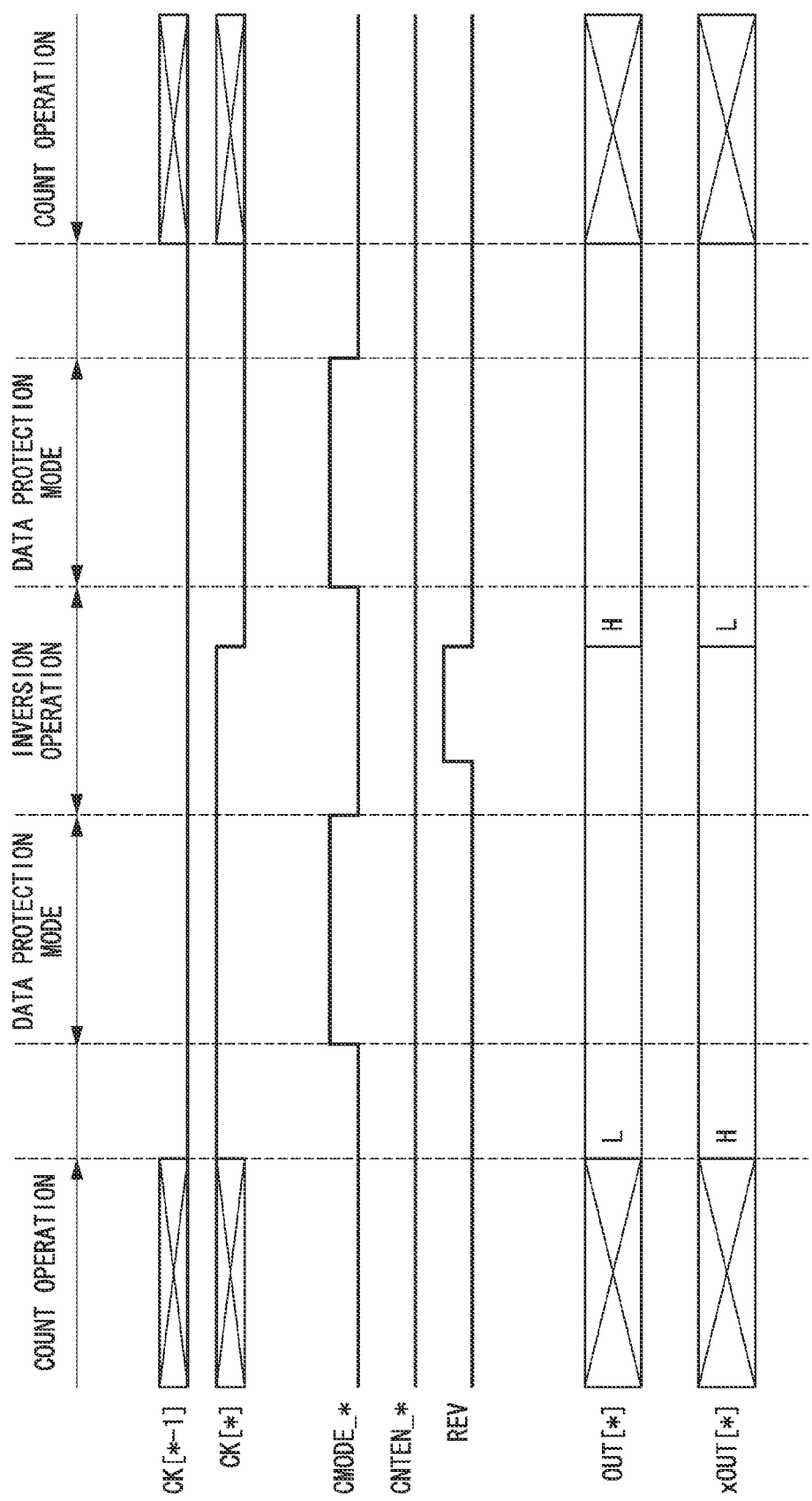
FIG. 11 is a timing chart showing an operation of the binary counter circuit according to the first embodiment of the present invention.

Next, an operation of the counter circuit C_*, particularly, a bit inversion operation, will be described. The timing chart of FIG. 11 shows waveforms of signals related to the operation of the counter circuit C_*, particularly, waveforms of signals related to an operation based on the bit inversion operation. During the count operation, the control CMODE_* is in the L state, the control signal CNTEN_* is in the L state, and the control signal REV is in the L state.

After the count operation, the control signal CMODE_* is in the H state. Thereby, because the output terminal Q and the input terminal D of the counter circuit C_* are connected, an output of the counter circuit C_* has a fixed state without a change, and each bit value is protected. For example, at this timing, a logical state of a control signal SEL_*(not shown) changes from being in the H state to being in the L state.

Subsequently, the control signal CMODE_* is in the L state and the inversion output terminal QB and the input terminal D of the counter circuit C_* are connected. Thereby, the state of a signal input to the input terminal D is inverted. Thereafter, the control signal REV changes from being in the L state to being in the H state, and further changes to being in the L state. When the control signal REV has changed from being in the H state to being in the L state, the flip-flop circuit DFF retains a signal input to the input terminal D and the retained signal is output from the output terminal Q. Because the state of the signal input to the input terminal D has been inverted when the control signal CMODE_* is in the L state as described above, the control signal REV changes from being in the H state to being in the L state, so that an output of the counter circuit C_*, that is, each bit value, is inverted.

Thereafter, the control signal CMODE_* is in the H state. Thereby, because the output terminal Q and the input terminal D of the counter circuit C_* are connected, the output of the counter circuit C_* has a fixed state without a change, and each bit value is protected. Finally, the control signal CMODE_* is in the L state, and the inversion output terminal QB and the input terminal D of the counter circuit C_* are connected. According to the above-described operation, it is possible to re-perform the count operation by designating a value obtained by inverting each bit value as an initial value.

As described above, according to this embodiment, it is possible to obtain digital data corresponding to a difference between the first pixel signal and the second pixel signal as a count value of the column count section 103 when the column count section 103 performs the count operation on the basis of each bit value constituting the second count value retained in the latch section 108 after an initial value is set in the column count section 103 on the basis of each bit value constituting the first count value retained in the latch section 108. Thus, it is possible to perform a subtraction operation (CDS process) on analog signals within a column section of the image apparatus and obtain a high-quality image.

In addition, it is possible to configure the column count section 103 with a counter circuit having a single count mode by setting a value obtained by inverting each bit value constituting the first count value retained in the latch section 108 to an initial value of the column count section 103.

Second Embodiment

Next, a second embodiment of the present invention will be described. Because a configuration of a (C)MOS imaging apparatus according to this embodiment is approximately the same as the configuration as described with reference to the first embodiment, a description thereof is omitted here.

Hereinafter, an operation of this embodiment different from the first embodiment will mainly be described. Hereinafter, first and second read operations and a subsequent subtraction operation (CDS process) will be described in detail. In order to facilitate description, it is assumed that the count mode of the main count section 18 is a count-up mode and the count mode of the column count section 103 is a count-down mode. In addition, the main count section 18 and the column count section 103 perform a count operation at the timing of a falling edge of a count clock. In addition, the description of the same operation as described above is appropriately omitted.

<First Read>

After the first read operation from the unit pixel 3 of an arbitrary pixel row to the vertical signal line 13 has been stabilized, the ramp section 19 outputs a ramp wave. The comparison section 109 compares the ramp wave to the reset level.

Meanwhile, the main count section 18 performs the count operation in the count-up mode and outputs a count value.

The comparison section 109 compares a ramp wave provided from the ramp section 19 to the reset level, and inverts a comparison output when voltages of the two are approximately consistent (a first timing). At the first timing, the latch section 108 retains an output from the main count section 18 as a first count value. When a predetermined period has elapsed, the main count section 18 stops the count operation and the ramp section 19 stops ramp wave generation.

Subsequently, the column count section 103 sequentially performs a subtraction operation on bits constituting the first count value retained in the latch section 108. Thereafter, each bit value of the column count section 103 is inverted. Thereby, an initial value of the column count section 103 is set.

<Second Read>

Subsequently, during the second read operation, a signal level corresponding to an amount of incident light of each unit pixel 3 is read and an operation similar to the first read operation is performed. After the second read operation from the unit pixels 3 of an arbitrary pixel row to the vertical signal line 13 has been stabilized, the ramp section 19 outputs a ramp wave. The comparison section 109 compares the ramp wave to the signal level. Meanwhile, the main count section 18 performs a count operation in the count-up mode, and outputs a count value.

The comparison section 109 compares the ramp wave provided from the ramp section 19 to the signal level, and inverts a comparison output when voltages of the two are approximately consistent (a second timing). At this second timing, the latch section 108 retains an output from the main count section 18 as a second count value. When a predetermined period has elapsed, the main count section 18 stops the count operation and the ramp section 19 stops ramp wave generation.

Subsequently, the column count section 103 sequentially performs a subtraction operation on bits constituting the second count value retained in the latch section 108. Thereby, a subtraction operation (CDS process) on the first count value and the second count value is performed. As described above, digital data corresponding to a difference between the reset level and the signal level is obtained. Finally, each bit value constituting digital data retained by the column count section 103 is inverted, and the inverted value is transferred by the horizontal selection section 14 to the output section 17 via the horizontal signal line.

Next, an operation of this embodiment will be described using a specific example. Hereinafter, the case in which a 6-bit up counter circuit is used as the main count section 18 and a 6-bit down counter circuit is used as the column count section 103 will be described. When the count operation has been performed in the count-down mode, a count value becomes 6'b00_000 (corresponding to 0), for example, if 0 is counted, and a count value becomes 6'b11_1001 (corresponding to −7), for example, if 7 is counted. When the count operation has been performed in the count-up mode, the count value becomes 6'b00_0000 (corresponding to 0), for example, if 0 is counted, and the count value becomes 6'b00_0111 (corresponding to 7), for example, if 7 is counted.

Hereinafter, an example in which a subtraction operation (CDS process) on a first pixel signal and a second pixel signal subsequent thereto is performed will be described. As in the first embodiment, the AD conversion according to this embodiment is divided into a first pixel signal processing period in which the first pixel signal is processed and a second pixel signal processing period in which the second pixel signal is processed for execution. The first pixel signal processing period includes a signal read period in which the first pixel signal is read from the unit pixel 3, a count period in which the main count section 18 performs a count operation according to the first pixel signal, and an initial value setting period in which a count value of the main count section 18 is set to an initial value of the column count section 103. The second pixel signal processing period includes a signal read period in which the second pixel signal is read from the unit pixel 3, a count period in which the main count section 18 performs a count operation according to the second pixel signal, and a subtraction period in which a subtraction operation on the first and second pixel signals is performed when the column count section 103 performs a count operation according to the count value of the main count section 18.

In this embodiment, a binary subtraction operation using a 2's complement number is performed. Assuming that a digital value obtained by converting the first pixel signal according to AD conversion is A and a digital value obtained by converting the second pixel signal according to AD conversion is B, a subtraction result becomes B−A. Because the main count section 18 performs the count operation in the count-up mode, a count result (first count value) of the main count section 18 in the count period of the first pixel signal processing period is A and a count result (second count value) of the main count section 18 in the count period of the second pixel signal processing period is B. A value of A that is the first count value is set to the initial value of the column count section 103. As a subtraction result, B−A can be obtained by inverting the sign after subtracting the second count value of B from A.

FIGS. 12 to 19 illustrate waveforms of signals during the first and second read operations. In FIGS. 12 to 19, Q[0] to Q[5] indicate outputs of the latch circuits D_0 to D_5 of the column count section 103, and OUT[0] to OUT[5] indicate outputs of the counter circuits C_0 to C_5 of the column count section 103. Here, the case in which a count value for the first pixel signal is 31 and a count value for the second pixel signal is 43 and a value of 12 is obtained by subtraction (CDS process) of the first pixel signal from the second pixel signal will be described.

<<First Read>>

Figure 12:
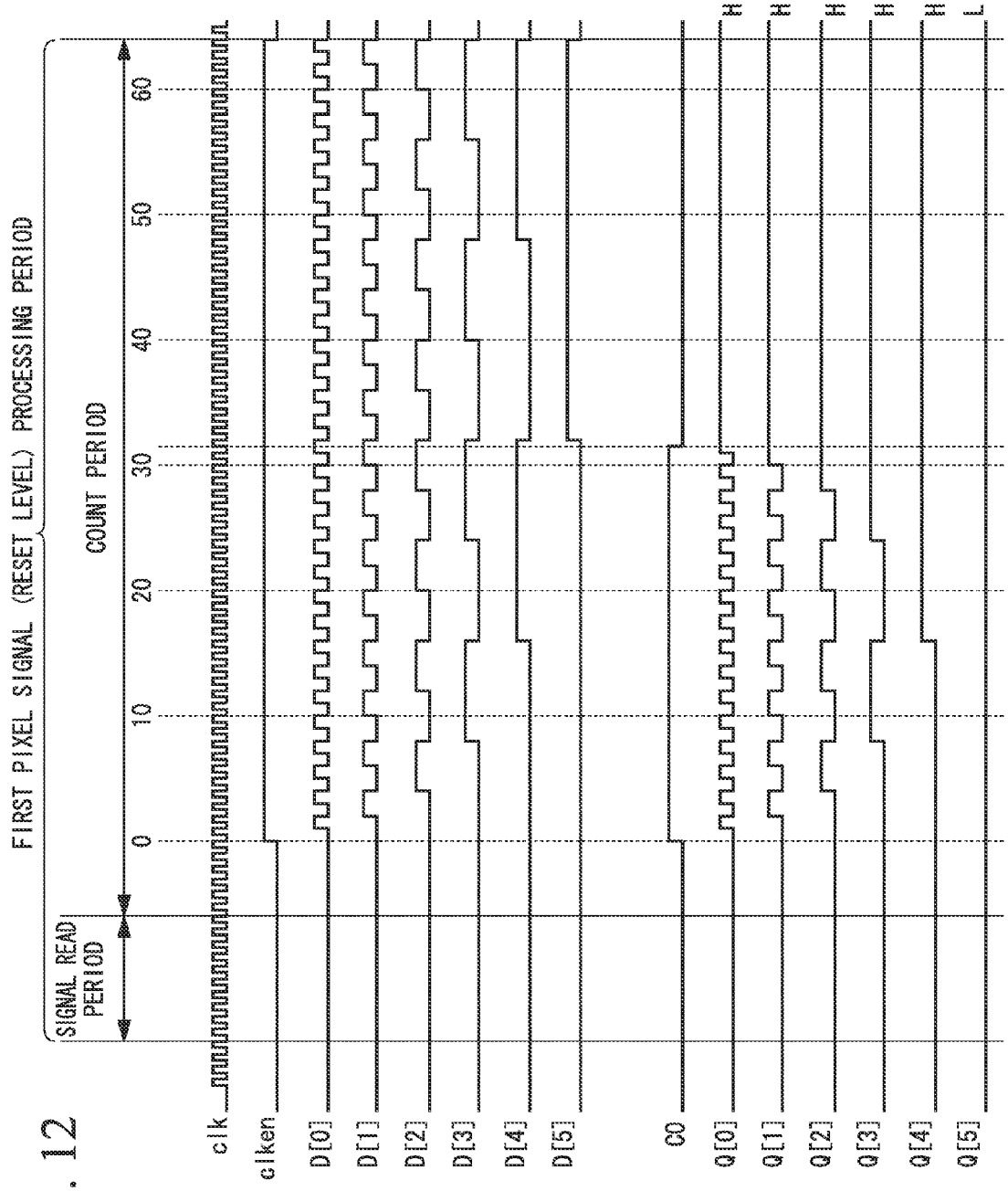
FIG. 12 is a timing chart showing an operation of a column AD conversion section according to a second embodiment of the present invention.
Figure 13:
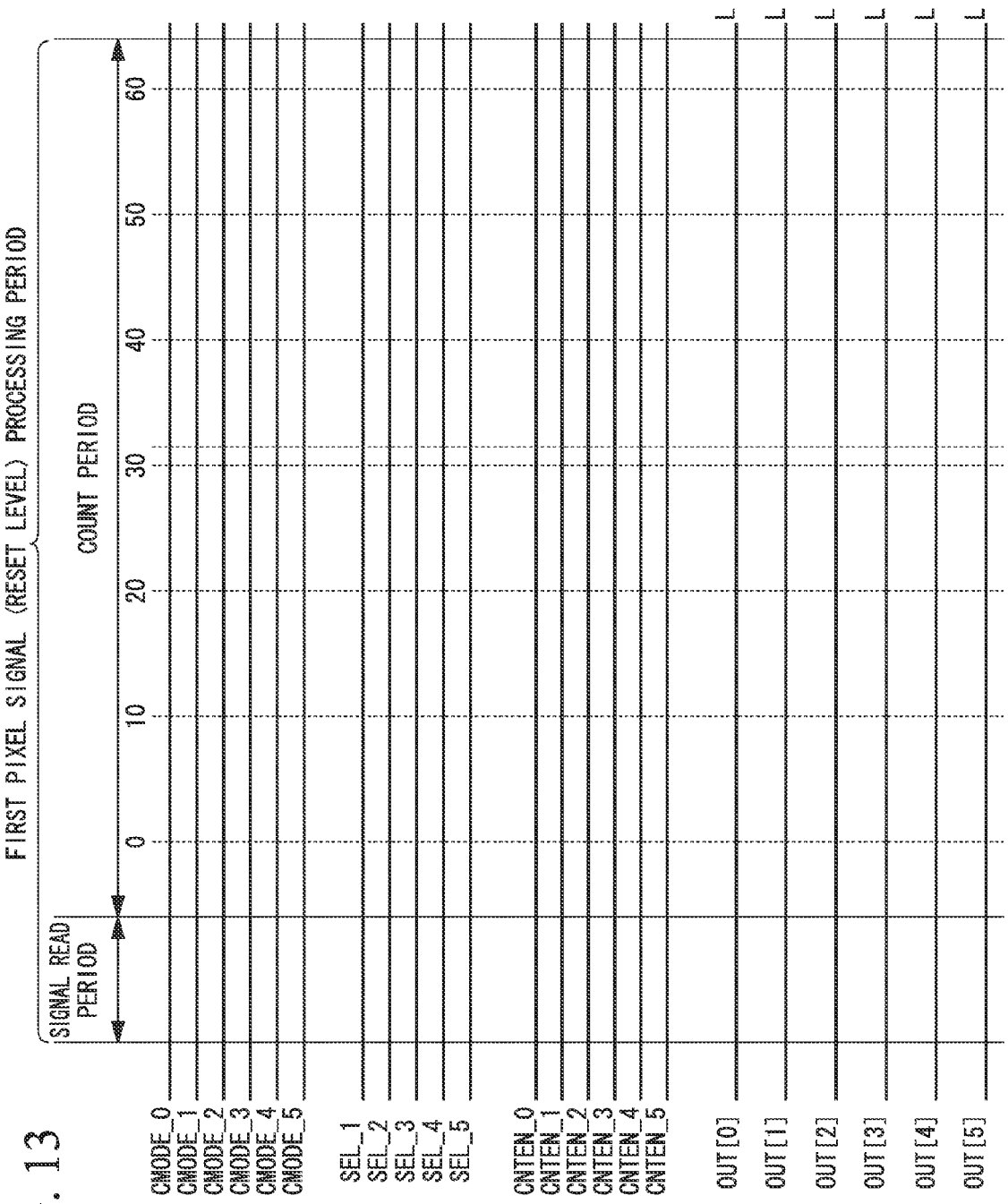
FIG. 13 is a timing chart showing an operation of the column AD conversion section according to the second embodiment of the present invention.

FIGS. 12 and 13 show operations of the signal read period and the count period related to the first pixel signal. It is assumed that the control signals SEL_1 to SEL_5 are in the L state, the control signals CNTEN_0 to CNTEN_5 are in the L state, and the control signals CMODE_0 to CMODE_5 are in the L state. Because the control signals SEL_1 to SEL_5 are in the L state, the switching sections MUX_1 to MUX_5 select outputs of the counter circuits C_0 to C_4. Because the control signals CMODE_0 to CMODE_5 are in the L state, operation modes of the counter circuit C_0 to C_5 are set to the count mode. In addition, the counter circuits C_0 to C_5 and the latch circuits D_0 to D_5 are reset according to control signals (not shown).

At the initiation of the comparison process, a value retained by the latch section 108 is 6'b00_0000 (corresponding to 0) and a value retained by the column count section 103 is 6'b00_0000 (corresponding to 0). After the first read operation from the unit pixels 3 of an arbitrary pixel row to the vertical signal line 13 has been stabilized in the signal read period, a count enable signal clken from the control section 20 to the main count section 18 changes from being in the L state to being in the H state simultaneously when the ramp section 19 starts an output of a ramp wave in the count period, and the main count section 18 starts an operation of counting a clock signal clk from the control section 20.

At a first timing at which a predetermined condition is satisfied (the first timing related to a comparison between the ramp wave provided from the ramp section 19 and the reset level in the above-described operation), a comparison output CO is inverted and outputs D[0] to D[5] from the main count section 18 are retained in the latch section 108 at the time (a first count value). At this time, a value retained by the latch section 108 is 6'b01_1111 (corresponding to 31) and a value retained by the column count section 103 is 6'b00_0000 (corresponding to 0).

Figure 14:
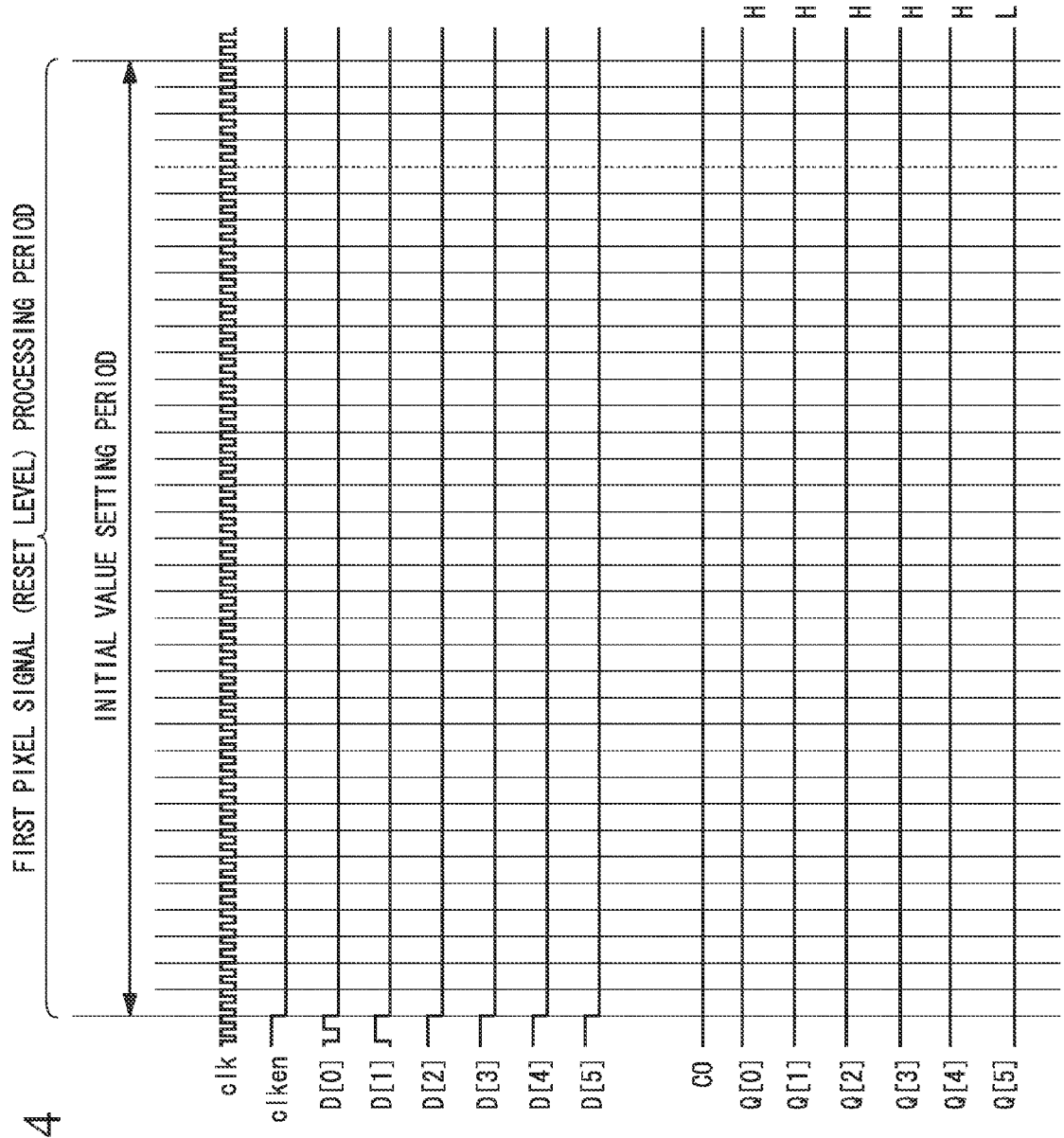
FIG. 14 is a timing chart showing an operation of the column AD conversion section according to the second embodiment of the present invention.
Figure 15:
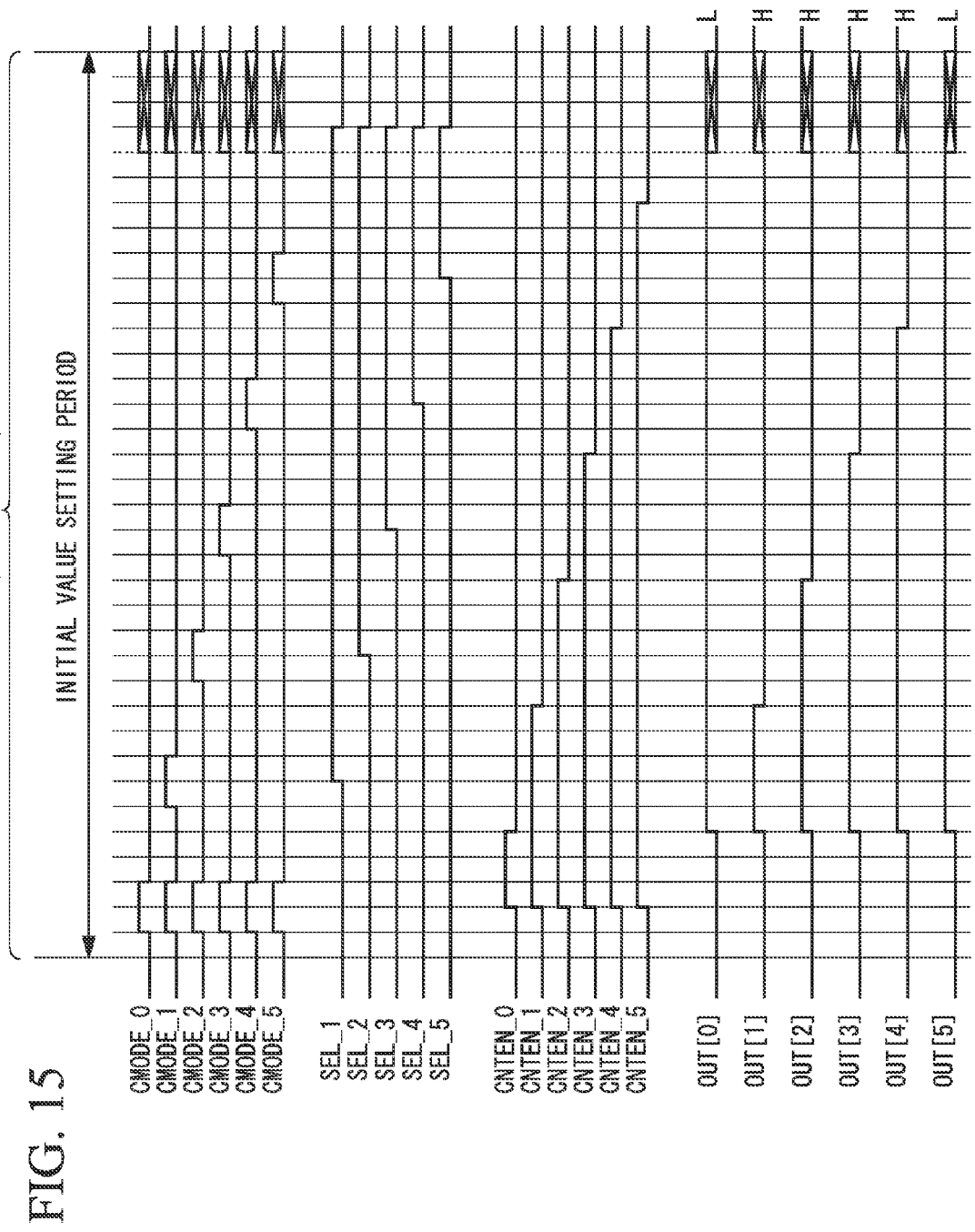
FIG. 15 is a timing chart showing an operation of the column AD conversion section according to the second embodiment of the present invention.

After the count enable signal clken from the control section 20 to the main count section 18 has the L state and the count period ends, bit values constituting the first count value retained in the latch section 108 are counted by the counter circuits C_0 to C_5 constituting the column count section 103 in the initial value setting period. FIGS. 14 and 15 show an operation of the initial value setting period related to the first pixel signal.

After the control signals CMODE_0 to CMODE_5 have changed from being in the L state to being in the H state and operation modes of the counter circuits C_0 to C_5 have been set to the data protection mode, the control signals CNTEN_0 to CNTEN_5 change from being in the L state to being in the H state.

Subsequently, the control signals CMODE_0 to CMODE_5 change from being in the H state to being in the L state and operation modes of the counter circuits C_0 to C_5 are set to the count mode. Thereby, the output Q[0] of the latch circuit D_0 is input to the counter circuit C_0 and also the outputs of the counter circuits C_0 to C_4 are input to the counter circuits C_1 to C_5, respectively. Thereafter, the control signal CNTEN_0 changes from being in the H state to being in the L state. Thereby, a value (1'b1) retained by the latch circuit D_0 is subtracted. At this time, the value retained by the latch section 108 is 6'b01_1111 (corresponding to 31) and the value retained by the column count section 103 is 6'b11_1111 (corresponding to −1).

Subsequently, the control signal CMODE_1 changes from being in the L state to being in the H state, and the operation mode of the counter circuit C_1 becomes the data protection mode. Further, after the control signal SEL_1 has changed from being in the L state to being in the H state, the control signal CMODE_1 changes from being in the H state to being in the L state. That is, after the switching section MUX_1 has selected an output of the latch circuit D_1, the operation mode of the counter circuit C_1 becomes the count mode. Because the control signals CNTEN_1 to CNTEN_5 are in the H state, the output Q[1] of the latch circuit D_1 is input to the counter circuit C_1 and also the outputs of the counter circuits C_1 to C_4 are input to the counter circuits C_2 to C_5, respectively. Thereafter, the control signal CNTEN_1 changes from being in the H state to being in the L state. Thereby, a value (1'b1) retained by the latch circuit D_1 is subtracted. At this time, the value retained by the latch section 108 is 6'b01_1111 (corresponding to 31) and the value retained by the column count section 103 is 6'b11_1101 (corresponding to −3).

Subsequently, the control signal CMODE_2 changes from being in the L state to being in the H state, and the operation mode of the counter circuit C_2 becomes the data protection mode. Further, after the control signal SEL_2 has changed from being in the L state to being in the H state, the control signal CMODE_2 changes from being in the H state to being in the L state. That is, after the switching section MUX_2 has selected an output of the latch circuit D_2, the operation mode of the counter circuit C_2 becomes the count mode. Because the control signals CNTEN_2 to CNTEN_5 are in the H state, the output Q[2] of the latch circuit D_2 is input to the counter circuit C_2 and also the outputs of the counter circuits C_2 to C_4 are input to the counter circuits C_3 to C_5, respectively. Thereafter, the control signal CNTEN_2 changes from being in the H state to being in the L state. Thereby, a value (1'b1) retained by the latch circuit D_2 is subtracted. At this time, the value retained by the latch section 108 is 6'b01_1111 (corresponding to 31) and the value retained by the column count section 103 is 6'b11_1001 (corresponding to −7).

Subsequently, the control signal CMODE_3 changes from being in the L state to being in the H state, and the operation mode of the counter circuit C_3 becomes the data protection mode. Further, after the control signal SEL_3 has changed from being in the L state to being in the H state, the control signal CMODE_3 changes from being in the H state to being in the L state. That is, after the switching section MUX_3 has selected an output of the latch circuit D_3, the operation mode of the counter circuit C_3 becomes the count mode. Because the control signals CNTEN_3 to CNTEN_5 are in the H state, the output Q[3] of the latch circuit D_3 is input to the counter circuit C_3 and also the outputs of the counter circuits C_3 and C_4 are input to the counter circuits C_4 and C_5, respectively. Thereafter, the control signal CNTEN_3 changes from being in the H state to being in the L state. Thereby, a value (1'b1) retained by the latch circuit D_3 is subtracted. At this time, the value retained by the latch section 108 is 6'b01_1111 (corresponding to 31) and the value retained by the column count section 103 is 6'b11_0001 (corresponding to −15).

Subsequently, the control signal CMODE_4 changes from being in the L state to being in the H state, and the operation mode of the counter circuit C_4 becomes the data protection mode. Further, after the control signal SEL_4 has changed from being in the L state to being in the H state, the control signal CMODE_4 changes from being in the H state to being in the L state. That is, after the switching section MUX_4 has selected an output of the latch circuit D_4, the operation mode of the counter circuit C_4 becomes the count mode. Because the control signals CNTEN_4 and CNTEN_5 are in the H state, the output Q[4] of the latch circuit D_4 is input to the counter circuit C_4 and also the output of the counter circuit C_4 is input to the counter circuit CS. Thereafter, the control signal CNTEN_4 changes from being in the H state to being in the L state. Thereby, a value (1'b1) retained by the latch circuit D_4 is subtracted. At this time, the value retained by the latch section 108 is 6'b01_1111 (corresponding to 31) and the value retained by the column count section 103 is 6'b10_0001 (corresponding to −31).

Subsequently, the control signal CMODE_5 changes from being in the L state to being in the H state, and the operation mode of the counter circuit CS becomes the data protection mode. Further, after the control signal SEL_5 has changed from being in the L state to being in the H state, the control signal CMODE_5 changes from being in the H state to being in the L state. That is, after the switching section MUX_5 has selected an output of the latch circuit D_5, the operation mode of the counter circuit C_5 becomes the count mode. Because the control signal CNTEN_5 is in the H state, the output Q[5] of the latch circuit D_5 is input to the counter circuit C_5. Thereafter, the control signal CNTEN_5 changes from being in the H state to being in the L state. Thereby, a value (1'b0) retained by the latch circuit D_5 is subtracted. At this time, the value retained by the latch section 108 is 6'b01_1111 (corresponding to 31) and the value retained by the column count section 103 is 6'b10_0001 (corresponding to −31).

Thereafter, the count value of the column count section 103 is inverted. At this time, the value retained by the latch section 108 is 6'b01_1111 (corresponding to 31) and the value retained by the column count section 103 is 6'b01_1110 (corresponding to 30). Because the column count section 103 subtracts the first count value, it is possible to set the same value as the first count value retained in the latch section 108 to the initial value of the column count section 103 by adding 1 after inverting the count value of the column count section 103. However, as will be described later, because value inversion is also performed during the second read operation, a value change by adding 1 after each inversion is canceled. Accordingly, in this embodiment, 1 is not added after the value inversion.

<<Second Read>>

Figure 16:
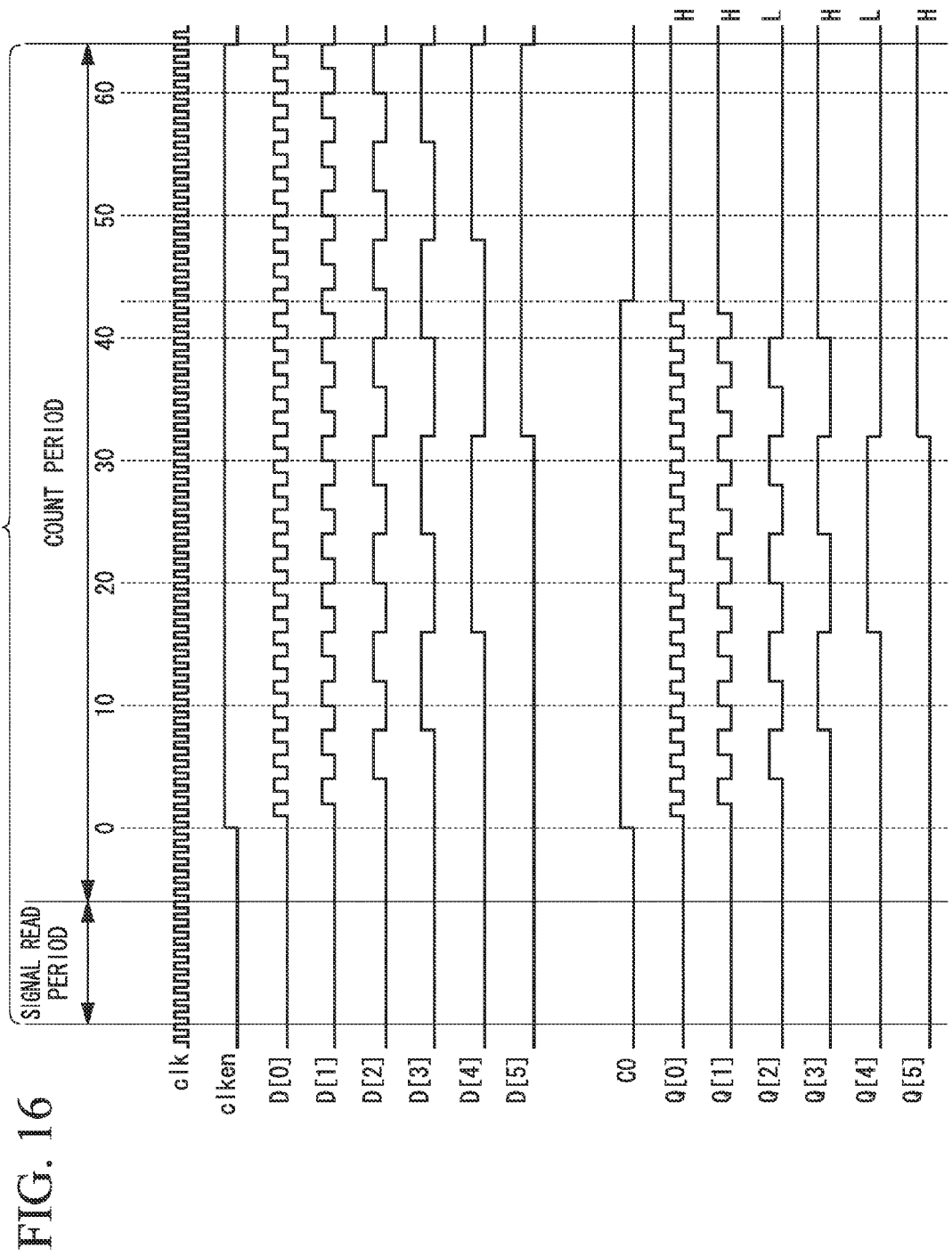
FIG. 16 is a timing chart showing an operation of the column AD conversion section according to the second embodiment of the present invention.
Figure 17:
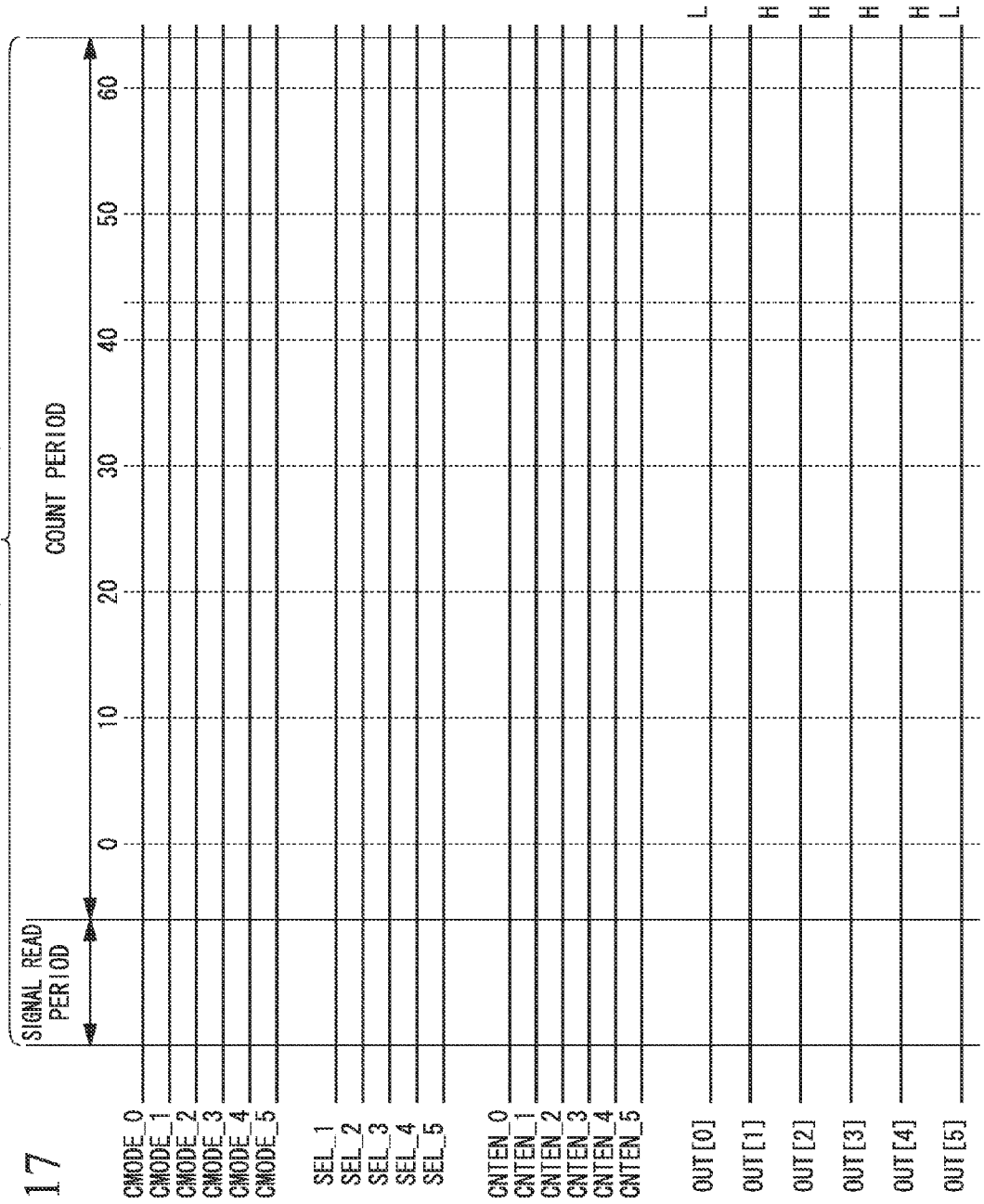
FIG. 17 is a timing chart showing an operation of the column AD conversion section according to the second embodiment of the present invention.

FIGS. 16 and 17 illustrate operations of the signal read period and the count period related to the second pixel signal. The control signals SEL_1 to SEL_5 are in the L state, the control signals CNTEN_0 to CNTEN_5 are in the L state, and the control signals CMODE_0 to CMODE_5 are in the L state. Because the control signals SEL_1 to SEL_5 are in the L state, the switching sections MUX_1 to MUX_5 select outputs of the counter circuits C_0 to C_4. Because the control signals CMODE_0 to CMODE_5 are in the L state, the operation modes of the counter circuits C_0 to C_5 are set to the count mode. However, the counter circuits C_0 to C_5 are not reset.

At the initiation of the comparison process, a value retained by the latch section 108 is 6'b00_0000 (corresponding to 0) and a value retained by the column count section 103 is 6'b01_1110 (corresponding to 30). After the second read operation from the unit pixel 3 of an arbitrary pixel row to the vertical signal line 13 has been stabilized in the signal read period, a count enable signal clken from the control section 20 to the main count section 18 changes from being in the L state to being in the H state simultaneously when the ramp section 19 starts an output of a ramp wave in the count period, and the main count section 18 starts an operation of counting a clock signal clk from the control section 20.

At a second timing at which a predetermined condition is satisfied (the second timing related to a comparison between the ramp wave provided from the ramp section 19 and the reset level in the above-described operation), a comparison output CO is inverted and outputs D[0] to D[5] from the main count section 18 are retained in the latch section 108 at the time (a second count value). At this time, a value retained by the latch section 108 is 6'b10_1011 (corresponding to 43) and a value retained by the column count section 103 is 6'b01_1110 (corresponding to 30).

Figure 18:
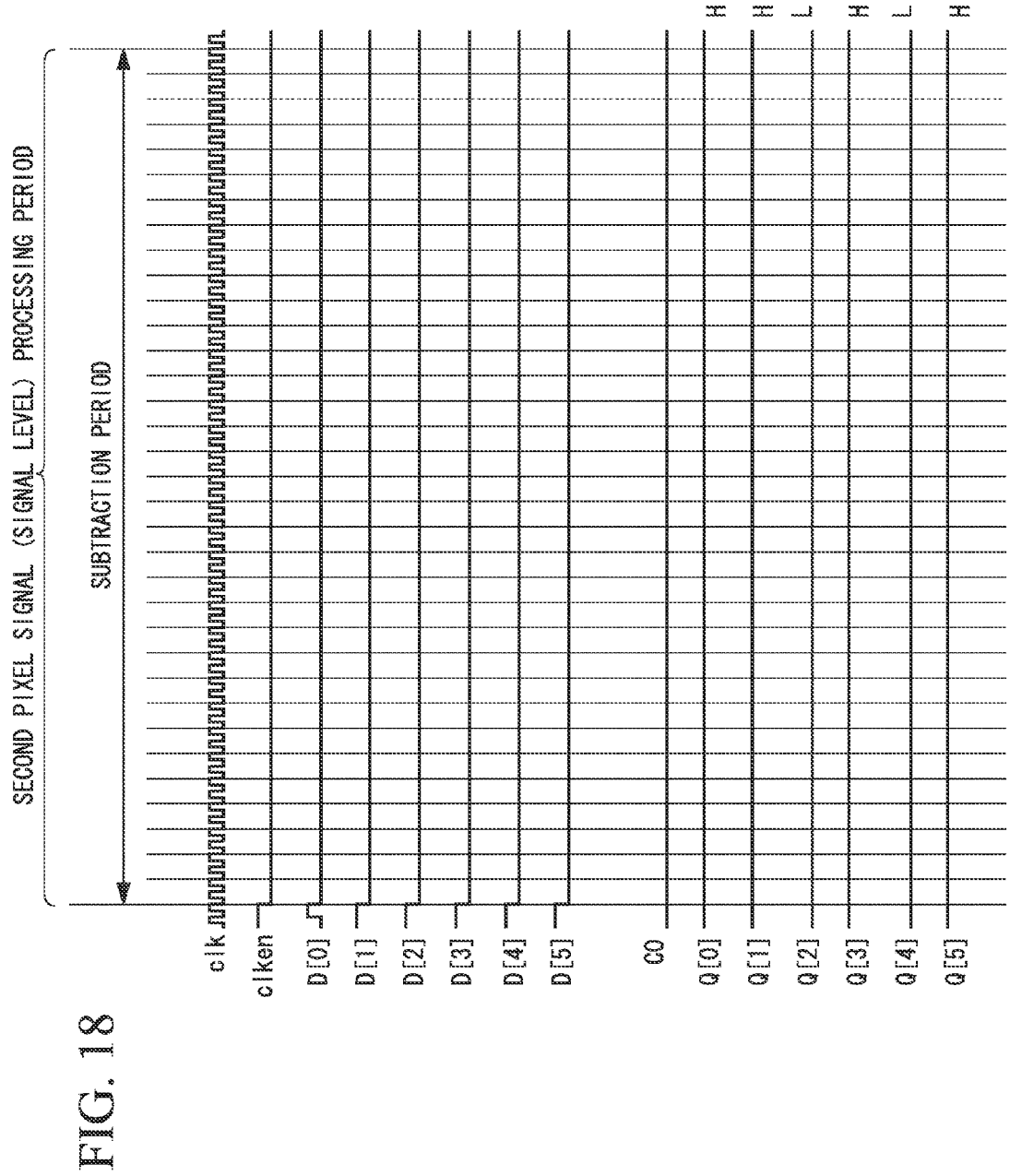
FIG. 18 is a timing chart showing an operation of the column AD conversion section according to the second embodiment of the present invention.
Figure 19:
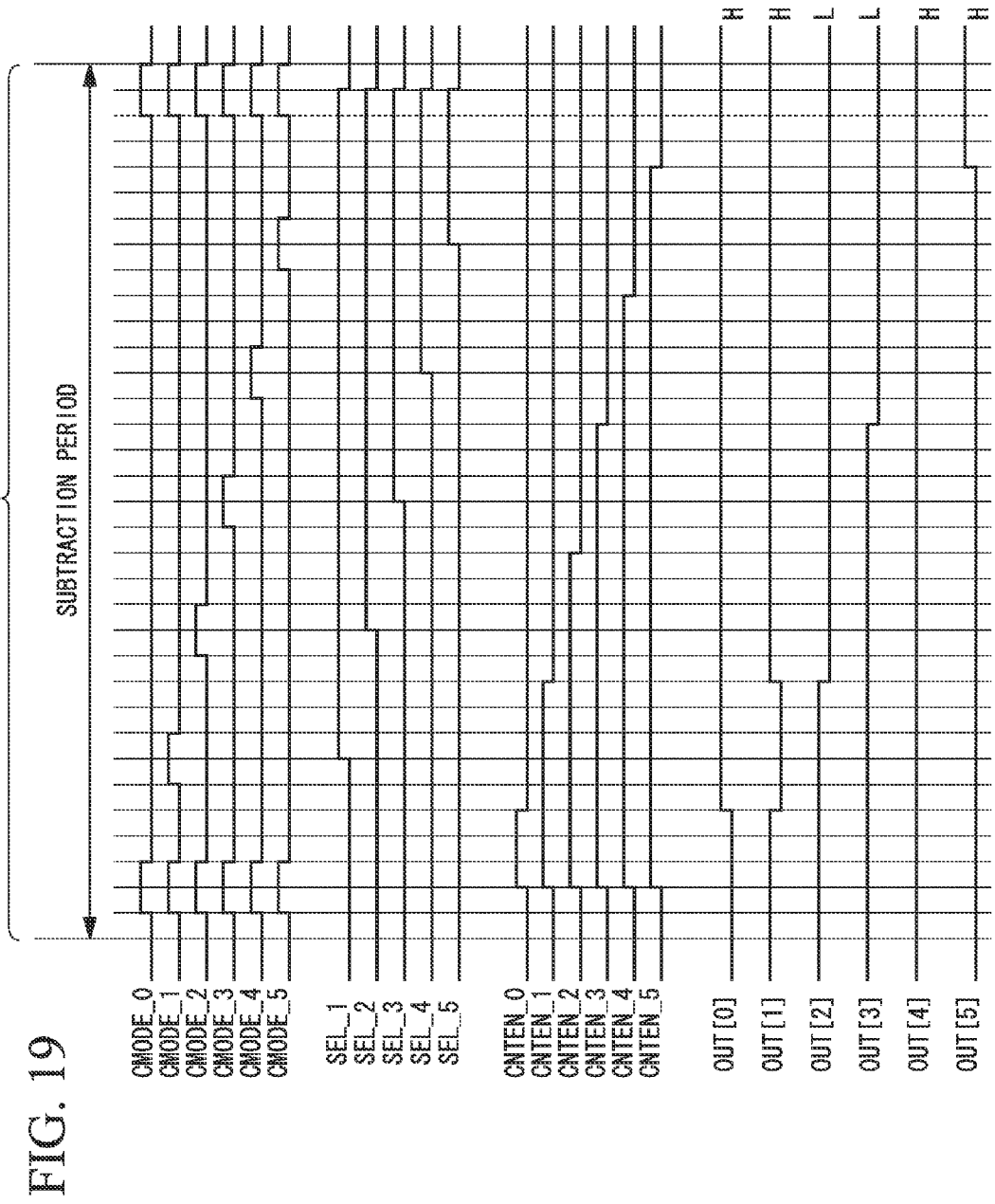
FIG. 19 is a timing chart showing an operation of the column AD conversion section according to the second embodiment of the present invention.

Subsequently, the column count section 103 sequentially performs a subtraction operation on bits constituting the second count value retained in the latch section 108. FIGS. 18 and 19 illustrate an operation of the subtraction period related to the second pixel signal. After the control signals CMODE_0 to CMODE_5 have changed from being in the L state to being in the H state and operation modes of the counter circuits C_0 to C_5 have been set to the data protection mode, the control signals CNTEN_0 to CNTEN_5 change from being in the L state to being in the H state. Subsequently, the control signals CMODE_0 to CMODE_5 change from being in the H state to being in the L state and operation modes of the counter circuits C_0 to C_5 are set to the count mode. Thereby, the output Q[0] of the latch circuit D_0 is input to the counter circuit C_0 and also the outputs of the counter circuits C_0 to C_4 are input to the counter circuits C_1 to C_5, respectively. Thereafter, the control signal CNTEN_0 changes from being in the H state to being in the L state. Thereby, a value (1'b1) retained by the latch circuit D_0 is subtracted. At this time, the value retained by the latch section 108 is 6'b10_1011 (corresponding to 43) and the value retained by the column count section 103 is 6'b01_1101 (corresponding to 29).

Subsequently, the control signal CMODE_1 changes from being in the L state to being in the H state, and the operation mode of the counter circuit C_1 becomes the data protection mode. Further, after the control signal SEL_1 has changed from being in the L state to being in the H state, the control signal CMODE_1 changes from being in the H state to being in the L state. That is, after the switching section MUX_1 has selected an output of the latch circuit D_1, the operation mode of the counter circuit C_1 becomes the count mode. Because the control signals CNTEN_1 to CNTEN_5 are in the H state, the output Q[1] of the latch circuit D_1 is input to the counter circuit C_1 and also the outputs of the counter circuits C_1 to C_4 are input to the counter circuits C_2 to C_5, respectively. Thereafter, the control signal CNTEN_1 changes from being in the H state to being in the L state. Thereby, a value (1'b1) retained by the latch circuit D_1 is subtracted. At this time, the value retained by the latch section 108 is 6'b10_1011 (corresponding to 43) and the value retained by the column count section 103 is 6'b01_1011 (corresponding to 27).

Subsequently, the control signal CMODE_2 changes from being in the L state to being in the H state, and the operation mode of the counter circuit C_2 becomes the data protection mode. Further, after the control signal SEL_2 has changed from being in the L state to being in the H state, the control signal CMODE_2 changes from being in the H state to being in the L state. That is, after the switching section MUX_2 has selected an output of the latch circuit D_2, the operation mode of the counter circuit C_2 becomes the count mode. Because the control signals CNTEN_2 to CNTEN_5 are in the H state, the output Q[2] of the latch circuit D_2 is input to the counter circuit C_2 and also the outputs of the counter circuits C_2 to C_4 are input to the counter circuits C_3 to C_5, respectively. Thereafter, the control signal CNTEN_2 changes from being in the H state to being in the L state. Thereby, a value (1'b0) retained by the latch circuit D_2 is subtracted. At this time, the value retained by the latch section 108 is 6'b10_1011 (corresponding to 43) and the value retained by the column count section 103 is 6'b01_1011 (corresponding to 27).

Subsequently, the control signal CMODE_3 changes from being in the L state to being in the H state, and the operation mode of the counter circuit C_3 becomes the data protection mode. Further, after the control signal SEL_3 has changed from being in the L state to being in the H state, the control signal CMODE_3 changes from being in the H state to being in the L state. That is, after the switching section MUX_3 has selected an output of the latch circuit D_3, the operation mode of the counter circuit C_3 becomes the count mode. Because the control signals CNTEN_3 to CNTEN_5 are in the H state, the output Q[3] of the latch circuit D_3 is input to the counter circuit C_3 and also the outputs of the counter circuits C_3 and C_4 are input to the counter circuits C_4 and C_5, respectively. Thereafter, the control signal CNTEN_3 changes from being in the H state to being in the L state. Thereby, a value (1'b1) retained by the latch circuit D_3 is subtracted. At this time, the value retained by the latch section 108 is 6'b10_1011 (corresponding to 43) and the value retained by the column count section 103 is 6'b01_0011 (corresponding to 19).

Subsequently, the control signal CMODE_4 changes from being in the L state to being in the H state, and the operation mode of the counter circuit C_4 becomes the data protection mode. Further, after the control signal SEL_4 has changed from being in the L state to being in the H state, the control signal CMODE_4 changes from being in the H state to being in the L state. That is, after the switching section MUX_4 has selected an output of the latch circuit D_4, the operation mode of the counter circuit C_4 becomes the count mode. Because the control signals CNTEN_4 and CNTEN_5 are in the H state, the output Q[4] of the latch circuit D_4 is input to the counter circuit C_4 and also the output of the counter circuit C_4 is input to the counter circuit CS. Thereafter, the control signal CNTEN_4 changes from the H state to the L state. Thereby, a value (1'b0) retained by the latch circuit D_4 is subtracted. At this time, the value retained by the latch section 108 is 6'b10_1011 (corresponding to 43) and the value retained by the column count section 103 is 6'b01_0011 (corresponding to 19).

Subsequently, the control signal CMODE_5 changes from being in the L state to being in the H state, and the operation mode of the counter circuit C_5 becomes the data protection mode. Further, after the control signal SEL_5 has changed from being in the L state to being in the H state, the control signal CMODE_5 changes from being in the H state to being in the L state. That is, after the switching section MUX_5 has selected an output of the latch circuit D_5, the operation mode of the counter circuit CS becomes the count mode. Because the control signal CNTEN_5 is in the H state, the output Q[5] of the latch circuit D_5 is input to the counter circuit C_5. Thereafter, the control signal CNTEN_5 changes from being in the H state to being in the L state. Thereby, a value (1'b1) retained by the latch circuit DS is subtracted. At this time, the value retained by the latch section 108 is 6'b10_1011 (corresponding to 43) and the value retained by the column count section 103 is 6'b11_0011 (corresponding to −13).

Finally, the count value of the column count section 103 is inverted (although omitted from FIG. 18). At this time, the value retained by the latch section 108 is 6'b10_1011 (corresponding to 43) and the value retained by the column count section 103 is 6'b00_1100 (corresponding to 12). Because value inversion is also made during the first read operation and 1 is not added as described above, 1 is not added after the value inversion in this embodiment.

Digital data after the subtraction operation (CDS process) on the first count value and the second count value) is transferred by the horizontal selection section 14 to the output section 17 via the horizontal signal line. The inversion of the digital data during the second read operation may also be performed after the digital data has been transferred to the output section 17. According to the above-described operation, binary data corresponding to a difference between the first pixel signal and the second pixel signal is obtained.

As described above, according to this embodiment, the column count section 103 performs the count operation on the basis of each bit value constituting the second count value retained in the latch section 108 after an initial value is set in the column count section 103 on the basis of each bit value constituting the first count value retained in the latch section 108. Thereby, it is possible to obtain digital data corresponding to a difference between the first pixel signal and the second pixel signal as a count value of the column count section 103. Thus, it is possible to perform a subtraction operation (CDS process) on analog signals within a column section of the image apparatus and obtain a high-quality image.

In addition, after the column count section 103 has obtained a count value (third count value) by sequentially counting each bit value constituting the first count value retained in the latch section 108, it is possible to configure the column count section 103 with a counter circuit having a single count mode by setting a value obtained by further inverting the count value to an initial value of the column count section 103.

Third Embodiment

Next, a third embodiment of the present invention will be described. Although a configuration of a (C)MOS imaging apparatus according to this embodiment is approximately the same as the configuration as described with reference to the first embodiment, the configuration of the main count section 18 is different.

The main count section 18 is configured of an up/down counter circuit having the count-down mode and the count-up mode as the count mode, and outputs a count value. When the count value includes, for example, 6 bits, the main count section 18 outputs D[0], D[1], D[2], D[3], D[4], and D[5]. Other configurations are approximately the same as in the first embodiment.

Next, an operation of this embodiment different from the first embodiment will mainly be described. Hereinafter, first and second read operations and a subsequent subtraction operation (CDS process) will be described in detail. In order to facilitate description, it is assumed that the count mode of the main count section 18 is the count-down mode in the first read operation and the count-up mode in the second read operation, and the count mode of the column count section 103 is the count-up mode. In addition, the main count section 18 and the column count section 103 perform a count operation at the timing of a falling edge of a count clock. In addition, a description of the same operation as described above is appropriately omitted here.

<First Read>

After the first read operation from the unit pixels 3 of an arbitrary pixel row to the vertical signal line 13 has been stabilized, the ramp section 19 outputs a ramp wave. The comparison section 109 compares the ramp wave to the reset level.

Meanwhile, the main count section 18 performs the count operation in the count-down mode and outputs a count value. Although it is preferable that the timing of a count operation start in the main count section 18 be approximately simultaneous with the timing of a ramp wave output start, the present invention is not limited thereto.

The comparison section 109 compares the ramp wave provided from the ramp section 19 to the reset level, and inverts a comparison output when voltages of the two are approximately consistent (a first timing). At this first timing, the latch section 108 retains an output from the main count section 18 as a first count value. When a predetermined period has elapsed, the main count section 18 stops the count operation and the ramp section 19 stops ramp wave generation. Subsequently, each bit constituting the first count value retained in the latch section 108 is set to a bit of the column count section 103. Thereby, an initial value of the column count section 103 is set.

<Second Read>

Subsequently, during the second read operation, a signal level corresponding to an amount of incident light of each unit pixel 3 is read and an operation similar to the first read operation is performed. After the second read operation from the unit pixels 3 of an arbitrary pixel row to the vertical signal line 13 has been stabilized, the ramp section 19 outputs a ramp wave. The comparison section 109 compares the ramp wave to the signal level. Meanwhile, the main count section 18 performs the count operation in the count-up mode and outputs a count value. Although it is preferable that the timing of a count operation start in the main count section 18 be approximately simultaneous with the timing of a ramp wave output start, the present invention is not limited thereto.

The comparison section 109 compares the ramp wave provided from the ramp section 19 to the signal level, and inverts a comparison output when voltages of the two are approximately consistent (a second timing). At this second timing, the latch section 108 retains an output from the main count section 18 as a second count value. When a predetermined period has elapsed, the main count section 18 stops the count operation and the ramp section 19 stops ramp wave generation.

Subsequently, the column count section 103 sequentially performs an addition operation on bits constituting the second count value retained in the latch section 108. Thereby, a subtraction operation (CDS process) on the first count value and the second count value is performed. As described above, digital data corresponding to a difference between the reset level and the signal level is obtained. Finally, digital data retained by the column count section 103 is transferred by the horizontal selection section 14 to the output section 17 via the horizontal signal line.

Next, an operation of this embodiment will be described using a specific example. Hereinafter, the case in which a 6-bit up/down counter circuit is used as the main count section 18 and a 6-bit up counter circuit is used as the column count section 103 will be described. When the count operation has been performed in the count-down mode, a count value becomes 6'b00_000 (corresponding to 0), for example, if 0 is counted, and a count value becomes 6'b11_1001 (corresponding to −7), for example, if 7 is counted. When the count operation has been performed in the count-up mode, a count value becomes 6'b00_0000 (corresponding to 0), for example, if 0 is counted, and a count value becomes 6'b00_0111 (corresponding to 7), for example, if 7 is counted.

Hereinafter, an example in which a subtraction operation (CDS process) on a first pixel signal and a second pixel signal subsequent thereto is performed will be described. As in the first embodiment, the AD conversion according to this embodiment is divided into a first pixel signal processing period in which the first pixel signal is processed and a second pixel signal processing period in which the second pixel signal is processed for execution. The first pixel signal processing period includes a signal read period in which the first pixel signal is read from the unit pixel 3, a count period in which the main count section 18 performs a count operation according to the first pixel signal, and an initial value setting period in which a count value of the main count section 18 is set to an initial value of the column count section 103. The second pixel signal processing period includes a signal read period in which the second pixel signal is read from the unit pixel 3, a count period in which the main count section 18 performs a count operation according to the second pixel signal, and a subtraction period in which a subtraction operation on the first and second pixel signals is performed when the column count section 103 performs a count operation according to the count value of the main count section 18.

Assuming that a digital value obtained by converting the first pixel signal according to AD conversion is A and a digital value obtained by converting the second pixel signal according to AD conversion is B, a subtraction result becomes B−A. Because the main count section 18 performs a count operation in the count-down mode during the first read operation, a count result (first count value) of the main count section 18 in the count period of the first pixel signal processing period is −A. In addition, because the main count section 18 performs a count operation in the count-up mode during the second read operation, a count result (second count value) of the main count section 18 in the count period of the second pixel signal processing period is B. A value of −A that is the first count value is set to the initial value of the column count section 103. As a subtraction result, B−A can be obtained by adding the second count value of B to −A.

FIGS. 20 to 25 show waveforms of signals during the first and second read operations. In FIGS. 20 to 25, Q[0] to Q[5] indicate outputs of the latch circuits D_0 to D_5 of the column count section 103, and OUT[0] to OUT[5] indicate outputs of the counter circuits C_0 to C_5 of the column count section 103. Here, the case in which a count value for the first pixel signal is 31 and a count value for the second pixel signal is 43 and a value of 12 is obtained by subtraction (CDS process) of the first pixel signal from the second pixel signal will be described.

<<First Read>>

Figure 20:
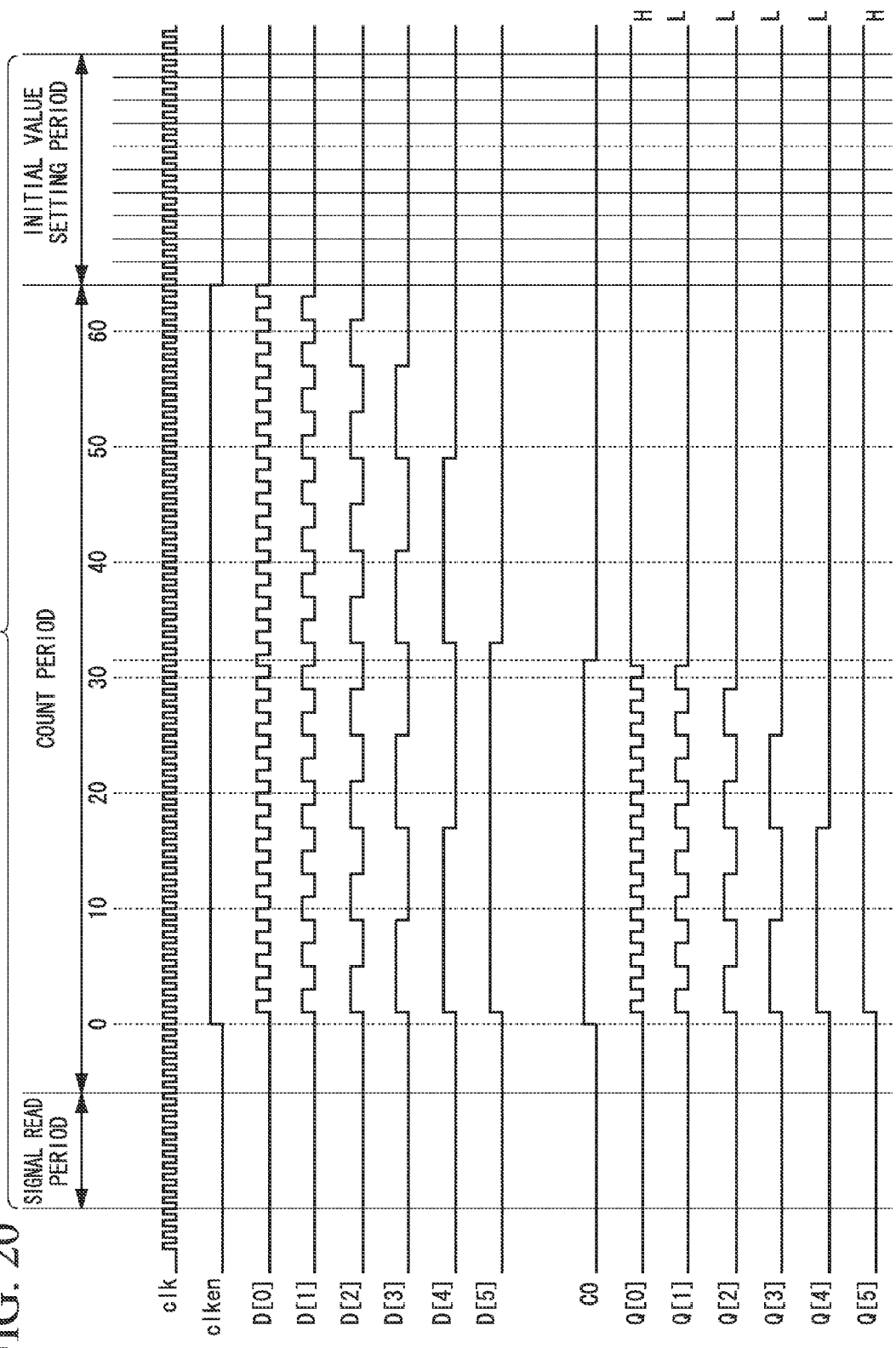
FIG. 20 is a timing chart showing an operation of a column AD conversion section according to a third embodiment of the present invention.
Figure 21:
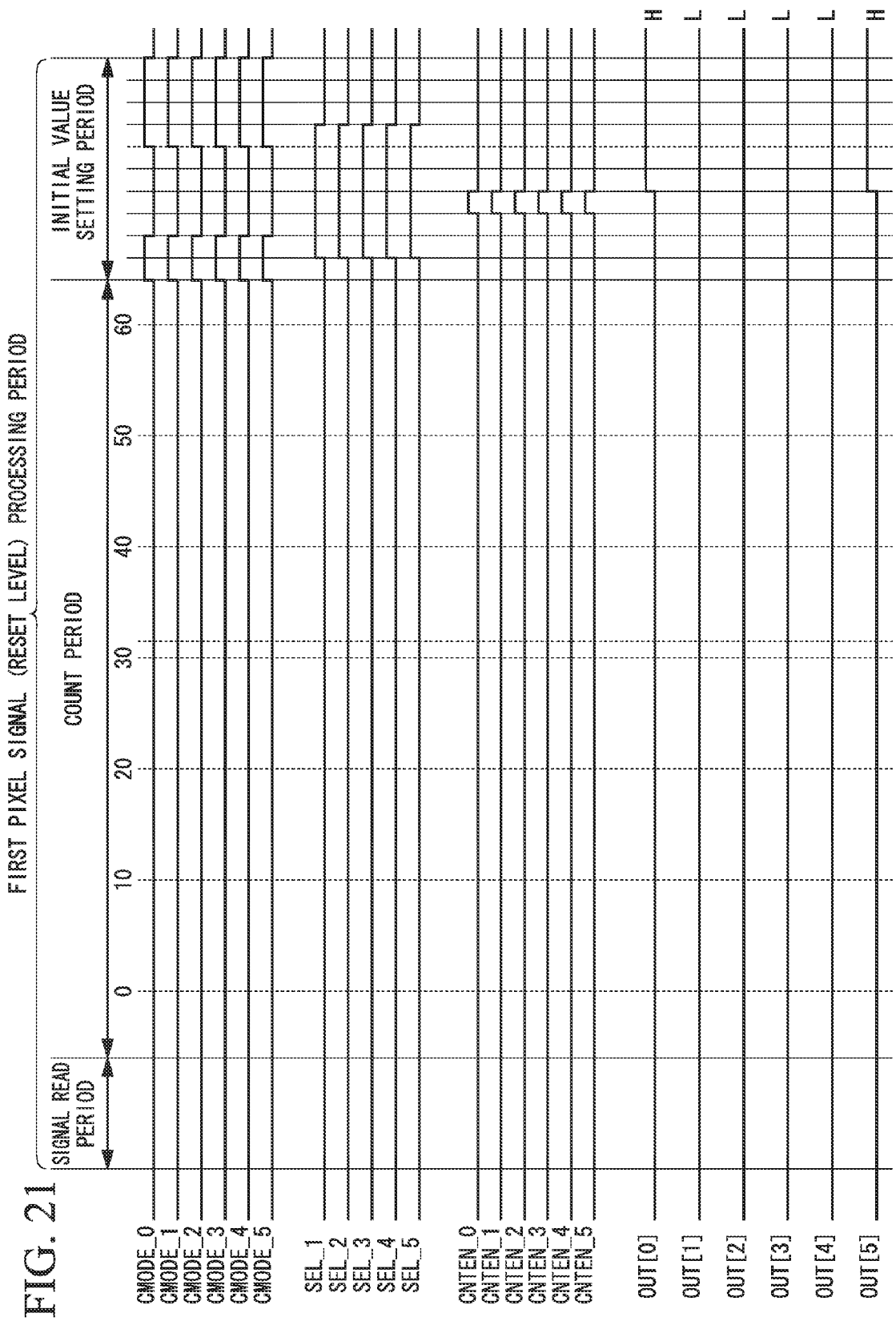
FIG. 21 is a timing chart showing an operation of the column AD conversion section according to the third embodiment of the present invention.

FIGS. 20 and 21 show operations of the signal read period, the count period and the initial value setting period related to the first pixel signal. It is assumed that control signals SEL_1 to SEL_5 are in the L state, control signals CNTEN_0 to CNTEN_5 are in the L state, and control signals CMODE_0 to CMODE_5 are in the L state. Because the control signals SEL_1 to SEL_5 are in the L state, the switching sections MUX_1 to MUX_5 select outputs of the counter circuits C_0 to C_4. Because the control signals CMODE_0 to CMODE_5 are in the L state, operation modes of the counter circuit C_0 to C_5 are set to the count mode. In addition, the counter circuits C_0 to C_5 and the latch circuits D_0 to D_5 are reset according to control signals (not shown).

At the initiation of the comparison process, a value retained by the latch section 108 is 6'b00_0000 (corresponding to 0) and a value retained by the column count section 103 is 6'b00_0000 (corresponding to 0). After the first read operation from the unit pixels 3 of an arbitrary pixel row to the vertical signal line 13 has been stabilized in the signal read period, a count enable signal clken from the control section 20 to the main count section 18 changes from being in the L state to being in the H state simultaneously when the ramp section 19 starts an output of a ramp wave in the count period, and the main count section 18 starts an operation of counting a clock signal clk from the control section 20.

At a first timing at which a predetermined condition is satisfied (the first timing related to a comparison between the ramp wave provided from the ramp section 19 and the reset level in the above-described operation), a comparison output CO is inverted and outputs D[0] to D[5] from the main count section 18 are retained in the latch section 108 at the time (a first count value). At this time, a value retained by the latch section 108 is 6'b10_0001 (corresponding to −31) and a value retained by the column count section 103 is 6'b00_0000 (corresponding to 0).

After the count enable signal clken from the control section 20 to the main count section 18 has the L state and the count period ends, values of bits constituting the first count value retained in the latch section 108 are set to bits of the counter circuits C_0 to C_5 constituting the column count section 103 in the initial value setting period. Specifically, after the control signals CMODE_0 to CMODE_5 have changed from being in the L state to being in the H state, the control signals SEL_1 to SEL_5 change from being in the L state to being in the H state and the control signals CMODE_0 to CMODE_5 further change from being in the H state to being in the L state. That is, after operation modes of the counter circuits C_0 to C_5 have been set to the data protection mode, the switching sections MUX_1 to MUX_5 select outputs of the latch circuits D_1 to D_5 and the operation modes of the counter circuits C_0 to C_5 are further set to the count mode.

Subsequently, the control signals CNTEN_0 to CNTEN_5 change from being in the L state to being in the H state and further change to being in the L state. Thereby, the first count value retained in the latch section 108 is retained in the column count section 103. At this time, the value retained by the latch section 108 is 6'b10_0001 (corresponding to −31) and the value retained by the column count section 103 is 6'b10_0001 (corresponding to −31).

<<Second Read>>

Figure 22:
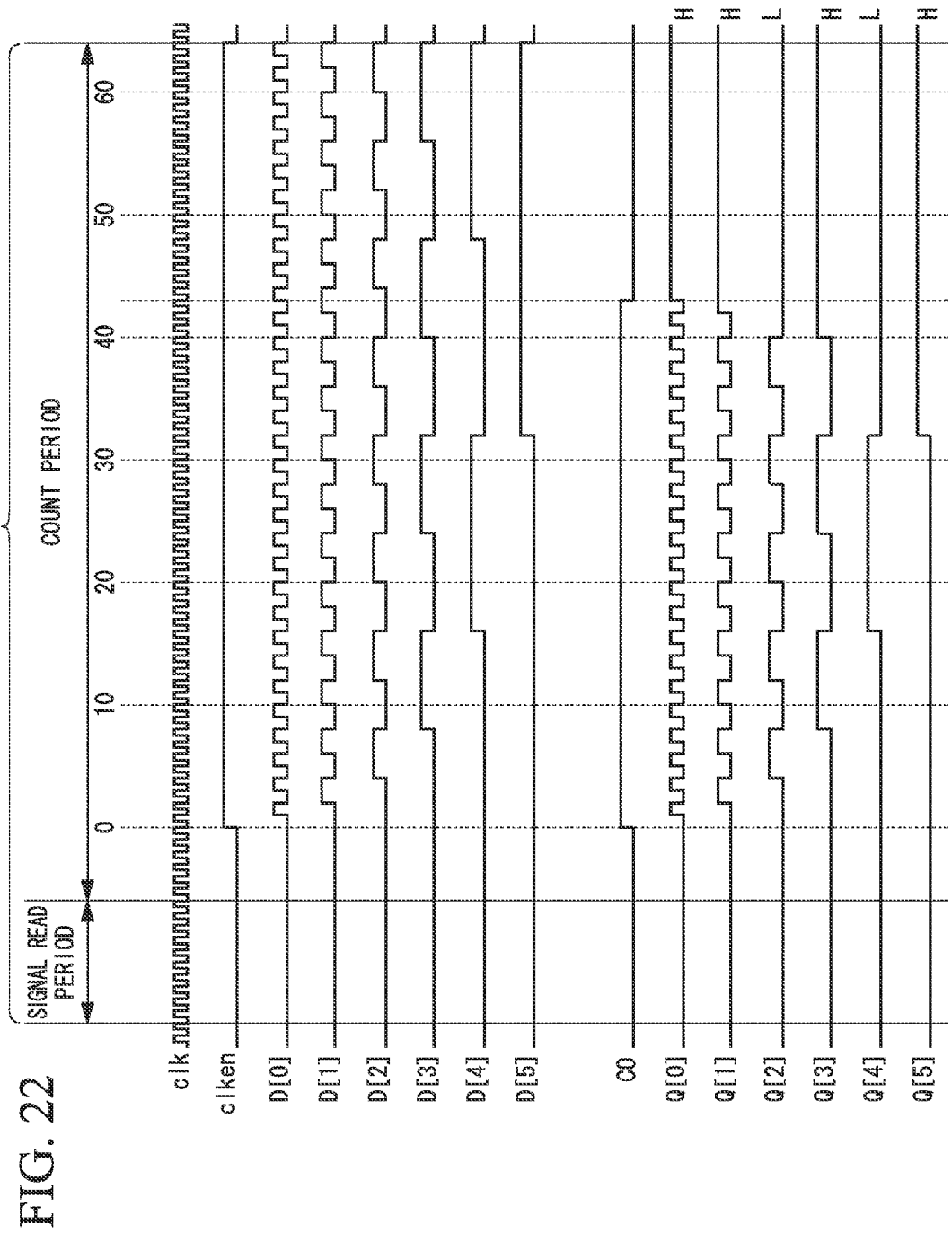
FIG. 22 is a timing chart showing an operation of the column AD conversion section according to the third embodiment of the present invention.
Figure 23:
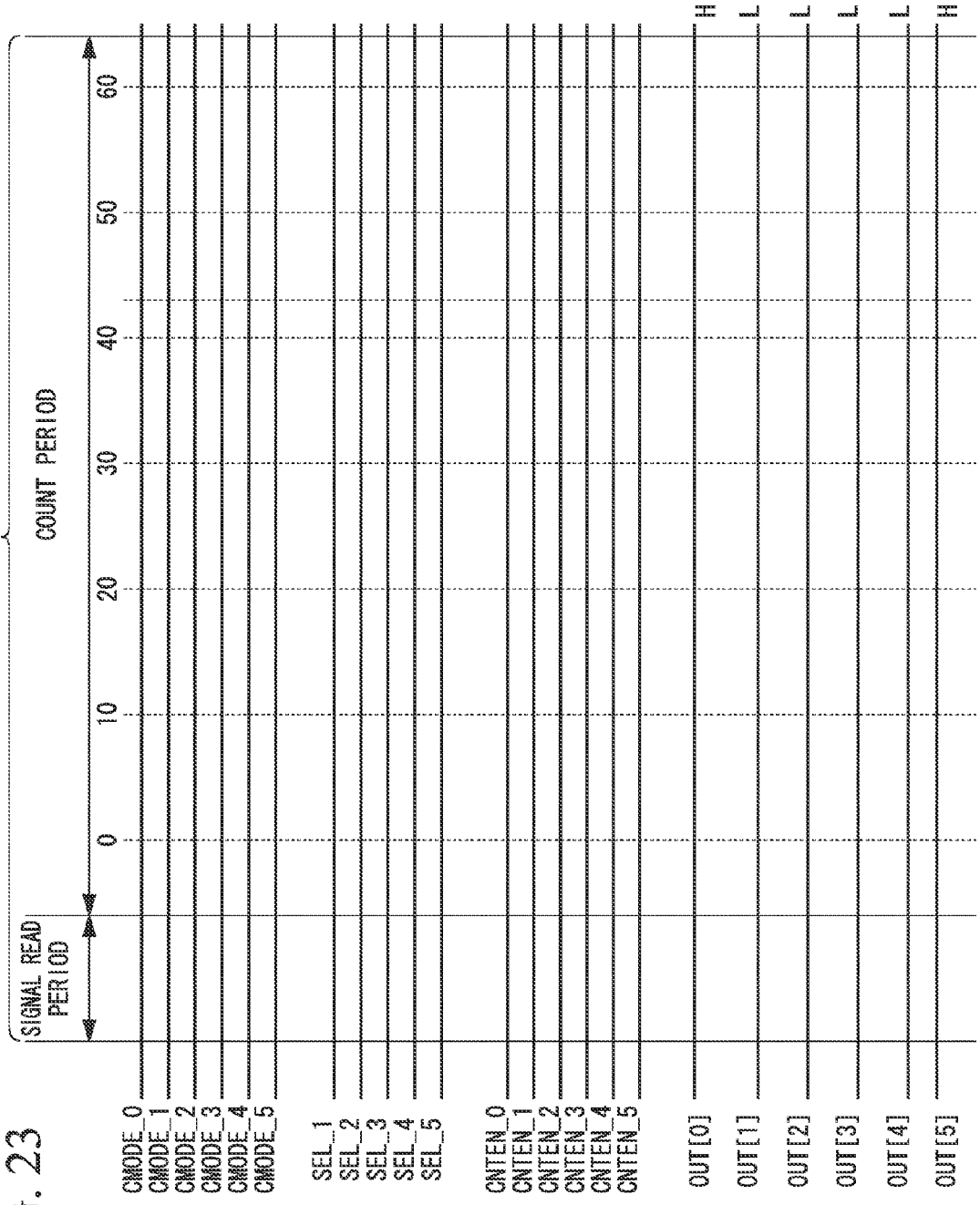
FIG. 23 is a timing chart showing an operation of the column AD conversion section according to the third embodiment of the present invention.

FIGS. 22 and 23 show operations of the signal read period and the count period related to the second pixel signal. The control signals SEL_1 to SEL_5 are in the L state, the control signals CNTEN_0 to CNTEN_5 are in the L state, and the control signals CMODE_0 to CMODE_5 are in the L state. Because the control signals SEL_1 to SEL_5 are in the L state, the switching sections MUX_1 to MUX_5 select outputs of the counter circuits C_0 to C_4. Because the control signals CMODE_0 to CMODE_5 are in the L state, the operation modes of the counter circuit C_0 to C_5 are set to the count mode. However, the counter circuits C_0 to C_5 are not reset.

At the initiation of the comparison process, a value retained by the latch section 108 is 6'b00_0000 and a value retained by the column count section 103 is 6'b10_0001 (corresponding to −31). After the second read operation from the unit pixels 3 of an arbitrary pixel row to the vertical signal line 13 has been stabilized in the signal read period, a count enable signal clken from the control section 20 to the main count section 18 changes from being in the L state to being in the H state simultaneously when the ramp section 19 starts an output of a ramp wave in the count period, and the main count section 18 starts an operation of counting a clock signal clk from the control section 20.

Subsequently, at a second timing at which a predetermined condition is satisfied (the second timing related to a comparison between the ramp wave provided from the ramp section 19 and the reset level in the above-described operation), a comparison output CO is inverted and outputs D[0] to D[5] from the main count section 18 are retained in the latch section 108 at the time (a second count value). At this time, a value retained by the latch section 108 is 6'b10_1011 (corresponding to 43) and a value retained by the column count section 103 is 6'b10_0001 (corresponding to −31).

Figure 24:
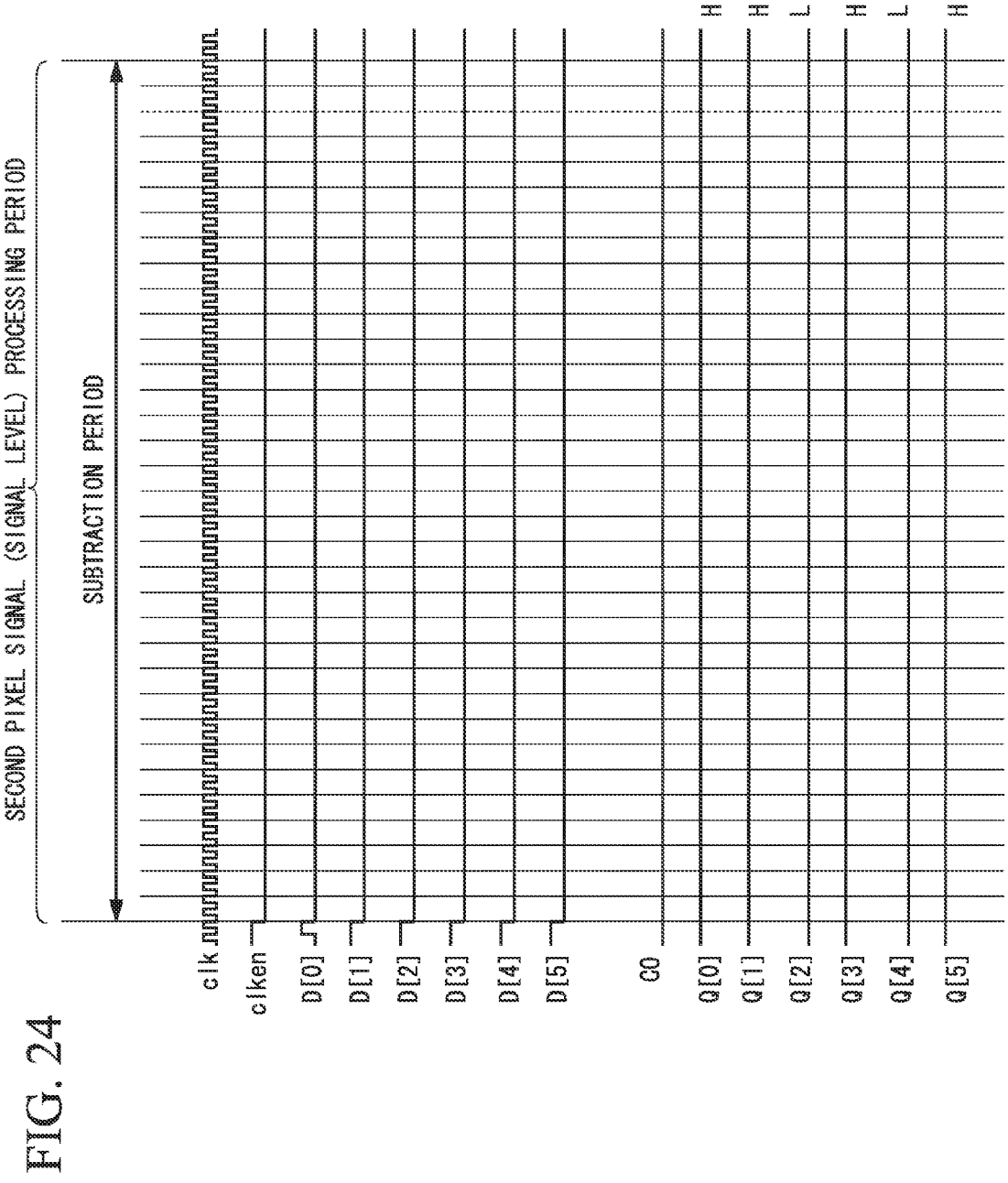
FIG. 24 is a timing chart showing an operation of the column AD conversion section according to the third embodiment of the present invention.
Figure 25:
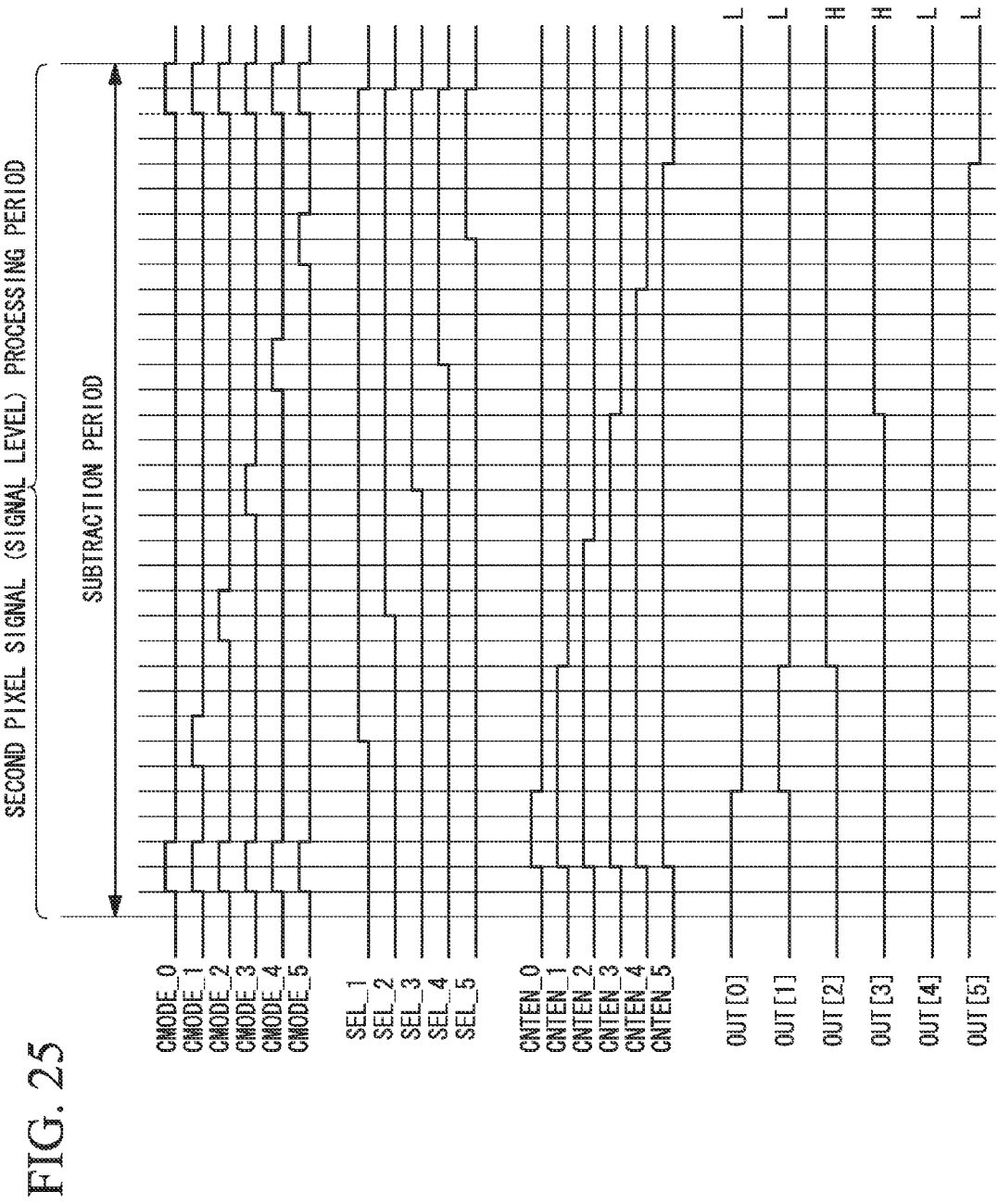
FIG. 25 is a timing chart showing an operation of the column AD conversion section according to the third embodiment of the present invention.
Figure 26:
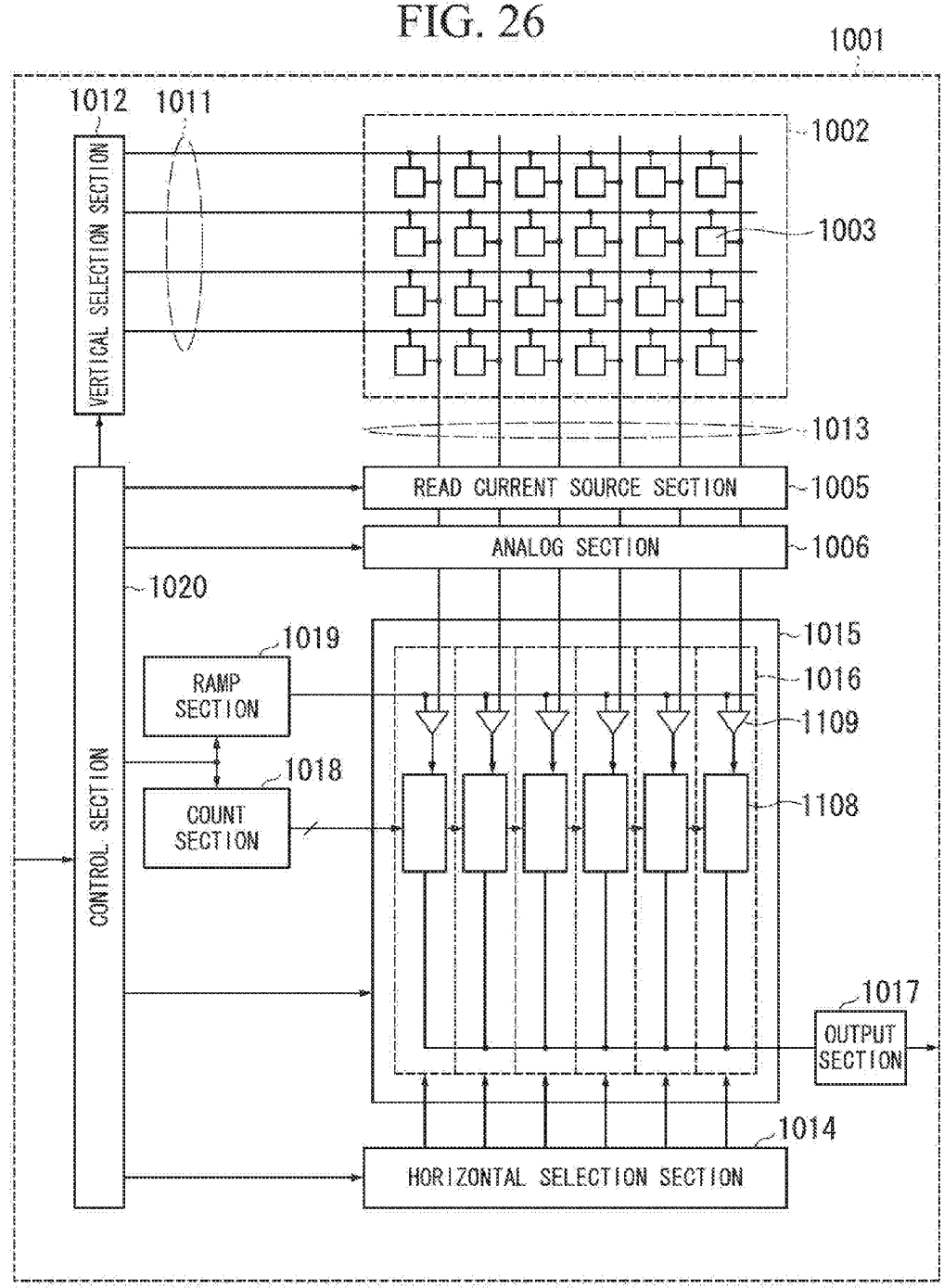
FIG. 26 is a block diagram showing a configuration of an imaging apparatus of the related art.

Subsequently, in the subtraction period, the column count section 103 sequentially performs an addition operation on bits constituting the second count value retained in the latch section 108. FIGS. 24 and 25 show an operation of the subtraction period related to the second pixel signal. After the control signals CMODE_0 to CMODE_5 have changed from being in the L state to being in the H state and operation modes of the counter circuits C_0 to C_5 have been set to the data protection mode, the control signals CNTEN_0 to CNTEN_5 change from being in the L state to being in the H state. Subsequently, the control signals CMODE_0 to CMODE_5 change from being in the H state to being in the L state, and the operation modes of the counter circuits C_0 to C_5 are set to the count mode. Thereby, the output Q[0] of the latch circuit D_0 is input to the counter circuit C_0 and also the outputs of the counter circuits C_0 to C_4 are input to the counter circuits C_1 to C_5, respectively. Thereafter, the control signal CNTEN_0 changes from being in the H state to being in the L state. Thereby, a value (1'b1) retained by the latch circuit D_0 is added. At this time, a value retained by the latch section 108 is 6'b10_1011 (corresponding to 43) and a value retained by the column count section 103 is 6'b10_0010 (corresponding to −30).

Subsequently, the control signal CMODE_1 changes from being in the L state to being in the H state, and the operation mode of the counter circuit C_1 becomes the data protection mode. Further, after the control signal SEL_1 has changed from being in the L state to being in the H state, the control signal CMODE_1 changes from being in the H state to being in the L state. That is, after the switching section MUX_1 has selected an output of the latch circuit D_1, the operation mode of the counter circuit C_1 becomes the count mode. Because the control signals CNTEN_1 to CNTEN_5 are in the H state, the output Q[1] of the latch circuit D_1 is input to the counter circuit C_1 and also the outputs of the counter circuits C_1 to C_4 are input to the counter circuits C_2 to C_5, respectively. Thereafter, the control signal CNTEN_1 changes from being in the H state to being in the L state. Thereby, a value (1'b1) retained by the latch circuit D_1 is added. At this time, a value retained by the latch section 108 is 6'b10_1011 (corresponding to 43) and a value retained by the column count section 103 is 6'b10_0100 (corresponding to −28).

Subsequently, the control signal CMODE_2 changes from being in the L state to being in the H state, and the operation mode of the counter circuit C_2 becomes the data protection mode. Further, after the control signal SEL_2 has changed from being in the L state to being in the H state, the control signal CMODE_2 changes from being in the H state to being in the L state. That is, after the switching section MUX_2 has selected an output of the latch circuit D_2, the operation mode of the counter circuit C_2 becomes the count mode. Because the control signals CNTEN_2 to CNTEN_5 are in the H state, the output Q[2] of the latch circuit D_2 is input to the counter circuit C_2 and also the outputs of the counter circuits C_2 to C_4 are input to the counter circuits C_3 to C_5, respectively. Thereafter, the control signal CNTEN_2 changes from being in the H state to being in the L state. Thereby, a value (1'b0) retained by the latch circuit D_2 is added. At this time, the value retained by the latch section 108 is 6'b10_1011 (corresponding to 43) and the value retained by the column count section 103 is 6'b10_0100 (corresponding to −28).

Subsequently, the control signal CMODE_3 changes from being in the L state to being in the H state, and the operation mode of the counter circuit C_3 becomes the data protection mode. Further, after the control signal SEL_3 has changed from being in the L state to being in the H state, the control signal CMODE_3 changes from being in the H state to being in the L state. That is, after the switching section MUX_3 has selected an output of the latch circuit D_3, the operation mode of the counter circuit C_3 becomes the count mode. Because the control signals CNTEN_3 to CNTEN_5 are in the H state, the output Q[3] of the latch circuit D_3 is input to the counter circuit C_3 and also the outputs of the counter circuits C_3 and C_4 are input to the counter circuits C_4 and C_5, respectively. Thereafter, the control signal CNTEN_3 changes from being in the H state to being in the L state. Thereby, a value (1'b1) retained by the latch circuit D_3 is added. At this time, the value retained by the latch section 108 is 6'b10_1011 (corresponding to 43) and the value retained by the column count section 103 is 6'b10_1100 (corresponding to −20).

Subsequently, the control signal CMODE_4 changes from being in the L state to being in the H state, and the operation mode of the counter circuit C_4 becomes the data protection mode. Further, after the control signal SEL_4 has changed from being in the L state to being in the H state, the control signal CMODE_4 changes from being in the H state to being in the L state. That is, after the switching section MUX_4 has selected an output of the latch circuit D_4, the operation mode of the counter circuit C_4 becomes the count mode. Because the control signals CNTEN_4 and CNTEN_5 are in the H state, the output Q[4] of the latch circuit D_4 is input to the counter circuit C_4 and also the output of the counter circuit C_4 is input to the counter circuit C_5. Thereafter, the control signal CNTEN_4 changes from being in the H state to being in the L state. Thereby, a value (1'b0) retained by the latch circuit D_4 is added. At this time, the value retained by the latch section 108 is 6'b10_1011 (corresponding to 43) and the value retained by the column count section 103 is 6'b10_1100 (corresponding to −20).

Subsequently, the control signal CMODE_5 changes from being in the L state to being in the H state, and the operation mode of the counter circuit C_5 becomes the data protection mode. Further, after the control signal SEL_5 has changed from being in the L state to being in the H state, the control signal CMODE_5 changes from being in the H state to being in the L state. That is, after the switching section MUX_5 has selected an output of the latch circuit D_5, the operation mode of the counter circuit C_5 becomes the count mode. Because the control signal CNTEN_5 is in the H state, the output Q[5] of the latch circuit D_5 is input to the counter circuit C_5. Thereafter, the control signal CNTEN_5 changes from being in the H state to being in the L state. Thereby, a value (1'b1) retained by the latch circuit D_5 is added. At this time, the value retained by the latch section 108 is 6'b10_1011 (corresponding to 43) and the value retained by the column count section 103 is 6'b00_1100 (corresponding to 12).

Digital data after the subtraction operation (CDS process) on the first count value and the second count value is transferred by the horizontal selection section 14 to the output section 17 via the horizontal signal line. According to the above-described operation, binary data corresponding to a difference between the first pixel signal and the second pixel signal is obtained.

As described above, according to this embodiment, it is possible to obtain digital data corresponding to a difference between the first pixel signal and the second pixel signal as a count value of the column count section 103 when the column count section 103 performs the count operation on the basis of each bit value constituting the second count value retained in the latch section 108 after an initial value is set in the column count section 103 on the basis of each bit value constituting the first count value retained in the latch section 108. Thus, it is possible to perform a subtraction operation (CDS process) on analog signals within a column section of the image apparatus and obtain a high-quality image.

In addition, the main count section 18 acquires the first count value by performing the count operation in the count-down mode, and acquires the second count value by performing the count operation in the count-up mode, so that the inversion operation is unnecessary in the column count section 103. However, in case that the signal level is read during the first read operation and the reset level is read during the second read operation, it is preferable that the main count section 18 acquire the first count value by performing the count operation in the count-up mode and acquire the second count value by performing the count operation in the count-down mode.

Although the embodiments of the present invention have been described above with reference to the drawings, specific configurations are not limited to these embodiments, and designs can also be made without departing from the scope of the present invention. For example, it is possible to easily implement a subtraction operation (CDS process) with a higher count section by applying the above-described embodiment to a lower count section of a solid-state imaging apparatus as disclosed in Figure 23.11.2 in Takayuki Toyama et al., "A 17.7 Mpixel 120 fps CMOS Image Sensor with 34.8 Gb/s Readout," Sony, Kanagawa, Japan ISSCC2011/SESSION23/IMAGE SENSORS/23.11.

Accordingly, the invention is not to be considered as being limited by the foregoing description, and is only limited by the scope of the appended claims.

What is claimed is:

1. An AD conversion circuit comprising:
   a reference signal generation section configured to generate a reference signal that increases or decreases with the passage of time;
   a comparison section configured to compare an analog signal to be subjected to AD conversion output from a pixel of an image apparatus to the reference signal, and configured to terminate a comparison process at a timing at which the reference signal has satisfied a predetermined condition for the analog signal;

a first count section configured to perform a count operation and outputting a count value;

a latch section configured to latch a second count value at a second timing related to an end of the comparison process corresponding to a second analog signal after latching a first count value at a first timing related to an end of the comparison process corresponding to a first analog signal; and a second count section configured to sequentially count values of bits constituting the second count value retained in the latch section after an initial value has been set in the second count section on the basis of values of bits constituting the first count value retained in the latch section, wherein digital data corresponding to a difference between the first analog signal and the second analog signal is output, and the latch section and the second count section are arranged for every column or every plurality of columns of a pixel array of the imaging apparatus.

2. The AD conversion circuit according to claim 1, wherein the initial value is an inversion count value obtained by inverting the values of the bits constituting the first count value.

3. The AD conversion circuit according to claim 1, wherein the initial value is an inversion count value obtained by further inverting a third count value after the third count value has been obtained by sequentially counting the values of the bits constituting the first count value.

4. The AD conversion circuit according to claim 1, wherein:
   a count mode of the first count section is a count-up mode and a count-down mode, and the first count value is a count value counted in one of the count-up mode and the count-down mode, and the second count value is a count value counted in the other of the count-up mode and the count-down mode.

5. An imaging apparatus comprising:
an imaging section in which a plurality of pixels having photoelectric conversion elements are arranged to output a signal corresponding to a reset level as a first analog signal and output a signal corresponding to an amount of an incident electromagnetic wave as a second analog signal; and the AD conversion circuit according to claim 1.

6. An imaging apparatus comprising:
an imaging section in which a plurality of pixels having photoelectric conversion elements are arranged to output a signal corresponding to a reset level as a first analog signal and output a signal corresponding to an amount of an incident electromagnetic wave as a second analog signal; and the AD conversion circuit according to claim 2.

7. An imaging apparatus comprising:
an imaging section in which a plurality of pixels having photoelectric conversion elements are arranged to output a signal corresponding to a reset level as a first analog signal and output a signal corresponding to an amount of an incident electromagnetic wave as a second analog signal; and the AD conversion circuit according to claim 3.

8. An imaging apparatus comprising:
an imaging section in which a plurality of pixels having photoelectric conversion elements are arranged to output a signal corresponding to a reset level as a first analog signal and output a signal corresponding to an amount of an incident electromagnetic wave as a second analog signal; and the AD conversion circuit according to claim 4.

* * * * *